(12) United States Patent
Uoyama et al.

(10) Patent No.: US 9,793,483 B2
(45) Date of Patent: Oct. 17, 2017

(54) HEXAFLUOROISOPROPANOL GROUP-CONTAINING DIAMINE, POLYIMIDE AND POLYAMIDE USING SAME, CYCLIZED PRODUCT THEREOF, AND METHOD FOR PRODUCING SAME

(71) Applicant: Central Glass Company, Limited, Ube-shi, Yamaguchi (JP)

(72) Inventors: Hiroki Uoyama, Saitama (JP); Kazuhiro Yamanaka, Tachikawa (JP)

(73) Assignee: Central Glass Company, Limited, Ube-shi (JP)

( * ) Notice: Subject to any disclaimer, the term of this patent is extended or adjusted under 35 U.S.C. 154(b) by 129 days.

(21) Appl. No.: 13/868,793

(22) Filed: Apr. 23, 2013

(65) Prior Publication Data
US 2014/0148571 A1    May 29, 2014

(30) Foreign Application Priority Data

Nov. 28, 2012 (JP) ................ 2012-260188

(51) Int. Cl.
| | | |
|---|---|---|
| C08G 69/26 | (2006.01) |
| H01L 51/00 | (2006.01) |
| C09K 11/06 | (2006.01) |
| H05B 33/14 | (2006.01) |
| C08G 73/10 | (2006.01) |
| C08L 79/08 | (2006.01) |
| C08F 8/32 | (2006.01) |
| H01L 51/50 | (2006.01) |

(52) U.S. Cl.
CPC .......... *H01L 51/0035* (2013.01); *C08G 69/26* (2013.01); *C09K 11/06* (2013.01); *H05B 33/14* (2013.01); *C08F 8/32* (2013.01); *C08G 73/1039* (2013.01); *C08G 2650/48* (2013.01); *C08L 79/08* (2013.01); *C09K 2211/1466* (2013.01); *H01L 51/5012* (2013.01)

(58) Field of Classification Search
CPC ....... C08L 79/08; C08F 8/32; C08G 73/1039; C08G 2650/48; C08G 69/26
See application file for complete search history.

(56) References Cited

U.S. PATENT DOCUMENTS

| | | | |
|---|---|---|---|
| 3,133,132 A | 5/1964 | Loeb et al. | |
| 7,728,103 B2* | 6/2010 | Saegusa et al. | 528/361 |
| 2009/0023886 A1 | 1/2009 | Saegusa et al. | |
| 2009/0292104 A1* | 11/2009 | Saegusa et al. | 528/331 |
| 2010/0029895 A1 | 2/2010 | Narizuka et al. | |
| 2010/0216967 A1 | 8/2010 | Allen et al. | |
| 2011/0301305 A1 | 12/2011 | Isono et al. | |
| 2012/0012527 A1 | 1/2012 | Allen et al. | |

FOREIGN PATENT DOCUMENTS

| | | |
|---|---|---|
| CN | 102527265 A | 7/2012 |
| JP | 63-190607 A | 8/1988 |
| JP | 3-274693 A | 12/1991 |
| JP | 4-93389 A | 3/1992 |
| JP | 5-194338 A | 8/1993 |
| JP | 11-343414 A | 12/1999 |
| JP | 2000-143804 A | 5/2000 |
| JP | 2002-105034 A | 4/2002 |
| JP | 2007-119503 A | 5/2007 |
| JP | 2007-119504 A | 5/2007 |

(Continued)

OTHER PUBLICATIONS

M. Hasegawa et al., Photophysics, photochemistry, and optical properties of polyimides, Progress in Polymer Science, vol. 26, pp. 259-335 (2001).

(Continued)

*Primary Examiner* — Gregory Listvoyb
(74) *Attorney, Agent, or Firm* — Crowell & Moring LLP

(57) ABSTRACT

Disclosed are a diamine represented by the following formula, a polyimide and a polyamide using the same as the raw material, a cyclized product thereof, and a method for producing the same. In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, $R^1$ represents a $C_{1-4}$alkyl group or a halogen group, and each of "a" and "b" independently represents an integer of 0-2, and $1 \le a+b \le 4$. The polyimide and the polyamide are a fluorescent polyimide and a fluorescent polyamide that are easily soluble in organic solvents to the extent that they can be formed into a film by a wet process when making an optical device, that have heat resistance and strength when formed into a film, and that have superior fluorescent characteristics.

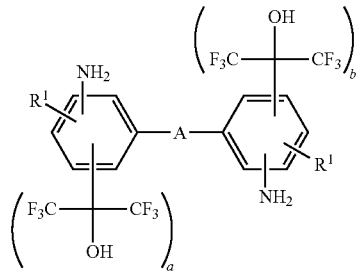

22 Claims, No Drawings

(56) References Cited

FOREIGN PATENT DOCUMENTS

| | | |
|---|---|---|
| JP | 2008-150534 A | 7/2008 |
| JP | 2009-149787 A | 7/2009 |
| JP | 2009-235048 A | 10/2009 |
| JP | 2010-215904 A | 9/2010 |
| JP | 2012-20281 A | 2/2012 |
| JP | 2012-518710 A | 8/2012 |
| WO | WO 2012/165455 A1 | 12/2012 |

OTHER PUBLICATIONS

G. Arjavalingam et al., Emission mechanism in polyimide, Polymer, vol. 31, pp. 840-844 (May 1990).

J. Wakita et al., Molecular Design, Synthesis, and Properties of Highly Fluorescent Polyimides, The Journal Physical Chemistry B 2009, vol. 113, pp. 15212-15224.

S. M. Pyo et al., Synthesis and blue light-emitting characteristic of rod-like poly (4, 4'-biphenylene pyromellitimide) with furyl side groups, Polymer vol. 40, pp. 125-130, 1998.

Japanese Written Opinion (PCT/ISA/237) dated Mar. 4, 2014 (Six (6) pages).

Japanese-language International Search Report (PCT/ISA/210) dated Mar. 4, 2014 (Six (6) pages).

Kenichi Okamoto et al., "Polymer Application", 1992, p. 16, vol. 41, No. 1.

S. Alexander Stern, "Polymers for Gas Separations: The Next Decade", Journal of Membrane Science, 1994, pp. 1-65, vol. 94.

"Plastics-Film and Sheeting-Determination of Gas-Transmission Rate-Part 1: Differential—Pressure Method", Japanese Industrial Standard JIS, K 7126-1: 2006, pp. 1166-1173.

Co-pending U.S. Appl. No. 13/868,652, filed Apr. 23, 2013.
Co-pending U.S. Appl. No. 13/868,663, filed Apr. 23, 2013.
Co-pending U.S. Appl. No. 13/868,784, filed Apr. 23, 2013.

\* cited by examiner

HEXAFLUOROISOPROPANOL GROUP-CONTAINING DIAMINE, POLYIMIDE AND POLYAMIDE USING SAME, CYCLIZED PRODUCT THEREOF, AND METHOD FOR PRODUCING SAME

TECHNICAL FIELD

The present invention relates to a hexafluoroisopropanol group-containing diamine, a polyimide or polyamide using the same, a cyclized product thereof, and a method for producing the same.

The present invention's hexafluoroisopropanol group-containing polyimide and polyamide, and its cyclized product are soluble in organic solvents, have heat resistance and strength, and can be used as fluorescent materials or organic light-emitting devices for optical devices, etc.

BACKGROUND OF THE INVENTION

In recent years, various light-emitting polymer compounds have been developed as optical devices of organic light-emitting devices etc. used for organic electroluminescence (EL) devices, light-emitting phototransformation devices or wavelength-transformation devices, etc.

If a polymer compound is soluble in organic solvents, it can be formed into a film by a wet process such as spin coating method, dipping method or ink jet method, etc., and it is easy to adjust the film thickness when forming a film.

When producing an optical device, the film formation by a wet process using such polymer compound lowers the optical device production cost, as compared with a vapor deposition process which requires a vacuum unit when forming a metal thin film or a low molecular weight organic thin film. Therefore, there is a demand for a light-emitting polymer compound that has heat resistance and strength, is soluble in organic solvents and usable for optical devices, and emits fluorescence.

As such light-emitting polymer compound, π-conjugated polymer compounds, such as poly-p-phenylene and polyphenylene vinylene, are generally known. Such π-conjugated polymer compounds are easily soluble in organic solvents, but have had a problem that heat resistance and a long term stability of fluorescence characteristics, such as fluorescence strength and fluorescence spectrum, are not sufficient.

Polyimides and polyamides have superior heat resistance, strength and electrical characteristics, but are low in fluorescence characteristics, in contrast with the above-mentioned light-emitting polymer compounds.

For example, as described in Non-patent Publication 1, polyimides are known to emit only a weak fluorescence against the ultraviolet irradiation and therefore to be extremely low in luminous efficiency. Index of luminous efficiency is expressed by light emission quantum yield defined as the proportion of the number of photons emitted by fluorescence to the number of photons absorbed into fluorescent molecules by excitation. In entire aromatic polyimides, light emission quantum yield is less than 0.01%. A very low luminous efficiency of polyimides is caused by a charge-transfer complex formed between an electron-donating diamine moiety and an electron-accepting acid anhydride moiety in the molecular structure. As mentioned in Non-patent Publication 2, it is known that a polyimide obtained by a polycondensation between pyromellitic anhydride as a typical polyimide and 4,4'-diaminophenyl ether emits only a very weak fluorescence of $9.7 \times 10^{-7}\%$ in fluorescence quantum yield, which is difficult to be measured by an ordinary fluorescence spectrometer.

Thus, various molecular designs have been made in order to improve luminous efficiency of polyimides.

For example, in Patent Publication 1 and Patent Publication 2, there is disclosed a fluorescent material formed of an independent film or a nanofiber aggregate. It is said to be able to synthesize a polyimide having a high light emission quantum yield of around 10% by using an alicyclic diamine as a raw material to provide steric hindrance, thereby eliminating an electron-donating diamine moiety to prevent an intermolecular charge transfer among polyimides.

The polyimide described in Patent Publication 1 and Non-patent Publication 3 is, however, a polyimide using an alicyclic diamine or an alicyclic acid dianhydride as a raw material and on the other hand is a semi-alicyclic polyimide combined with an aromatic ring. Therefore, there has been a problem of being difficult to say that it is superior in heat resistance and strength. Furthermore, in entire aromatic polyimides superior in heat resistance and strength, there has been a problem of no achievement of high light-emission characteristics.

There is conducted research of introducing a side chain having a chemical structure showing fluorescence, in order to obtain light emission property in polyimides.

For example, in Non-patent Publication 4, there is described a polyimide showing a blue color light emission by introducing a fluorescent furyl group into a main chain or side chain. In Patent Publication 2, there is disclosed an organic EL device characterized by having used a polymer thin film having at least one of light emission layer function or charge transfer function or charge injection function, and a polyimide is used in the polymer thin film. In an organic light emission device having a light emission layer and a charge transfer layer, the organic light emission device disclosed in Patent Publication 3 is such that the charge transfer layer is made of a particular polymer, and a polyimide is used as the polymer.

However, fluorescence emission of the polyimides described in Non-patent Publication 4, Patent Publication 2 and Patent Publication 3 results from a fluorescent substituent introduced into a main chain or a side chain of the polyimide, and light intensity of the polyimide obtained by introducing a fluorescent substituent is formed by a strong charge transfer of an imide moiety and a fluorescent substituent. However, there has been a problem that it is very low as compared with fluorescent strength of a low molecular weight compound having the same fluorescent substituent as that of the polyimide obtained by introducing a fluorescent substituent.

In the case of using polyimide for a device, there is a problem that its dissolution in organic solvents is difficult. A polyimide is obtained by conducting a polymerization reaction between tetracarboxylic dianhydride and diamine in a polar solvent to generate a polyamic acid soluble in the polar solvent and then dehydrating the polyamic acid by a chemical dehydration treatment such as heating treatment or using a dehydration agent to achieve an imidization. Polyamic acid as a precursor is easily formed into a film and easily worked. When making a polyimide after a film formation under a condition of polyamic acid, there has been a problem that chemical change of the polyamic acid as a component prior to the imidization does not occur evenly, resulting in a tendency to make a defective film.

Therefore, it is desirable to form a film under a condition of polyimide. Thus, there is a demand for a polyimide of a structure high in solubility.

In order to provide a polyimide with solubility in organic solvents, it is effective to introduce a polar group such as hydroxy group, carboxyl group or amino group. In Patent Publications 4-6, there are disclosed as a fluorine-containing polymerizable monomer an aromatic diamine containing a hexafluoroisopropanol group having a hydroxy group, and a polymer compound using the same, for example, an aromatic polyimide. The aromatic polyimide is said to be easily soluble in organic solvents. However, there has been no report on aromatic polyimides superior in fluorescence that is a property of emitting fluorescence.

PRIOR ART PUBLICATIONS

Patent Publications

Patent Publication 1: Japanese Patent Application Publication 2009-149787
Patent Publication 2: Japanese Patent Application Publication Heisei 03-274693
Patent Publication 3: Japanese Patent Application Publication Heisei 04-93389
Patent Publication 4: Japanese Patent Application Publication 2007-119503
Patent Publication 5: Japanese Patent Application Publication 2007-119504
Patent Publication 6: Japanese Patent Application Publication 2008-150534

Non-Patent Publications

Non-patent Publication 1: M. Hasegawa and K. Horie, Progress in Polymer Science, 26, 259-335 (2001)
Non-patent Publication 2: G. Arjavalingam et al., Polymer, 31, 840-844 (1990)
Non-patent Publication 3: J. Wakita et al., The Journal Physical Chemistry B 2009, 113, 15212-15224
Non-patent Publication 4: S. M. Pyo et al., Polymer, 40, 125-130 (1999)

SUMMARY OF THE INVENTION

As mentioned above, there have been reports of various polyimides as fluorescent polyimides which emit fluorescence. However, there has been a problem of being not known a fluorescent polyimide that is easily soluble in organic solvents, has heat resistance and strength when formed into a film, and shows a high light emission quantum yield.

It is an object of the present invention to provide a fluorescent polyimide and a fluorescent polyamide that are easily soluble in organic solvents to the extent that they can be formed into a film by a wet process when making an optical device, that have heat resistance and strength when formed into a film, and that have superior fluorescent characteristics. Furthermore, it is an object to provide a diamine that is a raw material of the fluorescent polyimide and the fluorescent polyamide.

As a result of an eager study, the present inventors synthesized a novel diamine containing an aromatic ring having a hexafluoroisopropanol group and an alkyl group or halogen group. Then, using the diamine as a raw material compound, by its polymerization with a tetracarboxylic dianhydride or a dicarboxylic acid or its derivative, we obtained a polyimide, a polyamide, or a polymer formed by a cyclization of an amide moiety of the polyamide, having a hexafluoroisopropanol group and an alkyl group. Furthermore, a polyamic acid as a precursor of the polyimide also belongs to the category of the present invention.

The obtained polyimide, the polyamide, or a polymer formed by a cyclization of an amide moiety of the polyamide is easily soluble in organic solvents. Furthermore, it has heat resistance and strength when formed into a film. Due to a strong electrostatic repulsion of fluorine atoms of HFIP group, in addition to a steric hindrance between the hexafluoroisopropanol group and the alkyl group or halogen group, that is, fluoro group (—F), chloro group (—Cl), bromo group (—Br) or iodo group (—I), it is possible to efficiently suppress the intermolecular charge transfer to show fluorescent characteristics. Therefore, it can be used as a fluorescent material or an organic light-emitting device for optical devices, etc.

Furthermore, the polyimide or polyamide synthesized by using the diamine as a raw material compound, or the polymer formed by a cyclization of an amide moiety of the polyamide has a bulky hexafluoroisopropanol group and an alkyl group or halogen group. Therefore, it has an action to make polyimides, which are generally slightly soluble in organic solvents, easily soluble in organic solvents. As compared with polyimide and polyamide prepared by using a diamine containing only hexafluoroisopropanol group, which are disclosed in conventional technologies such as Patent Publications 4-6, the polyimide or polyamide formed by using as a raw material compound a diamine containing alkyl group and halogen group in addition to hexafluoroisopropanol group, or the polymer formed by a cyclization of an amide moiety of the polyamide of the present invention shows useful effects as mentioned above.

The present invention contains Inventions 1-20.
[Invention 1]
A diamine represented by the general formula (1),

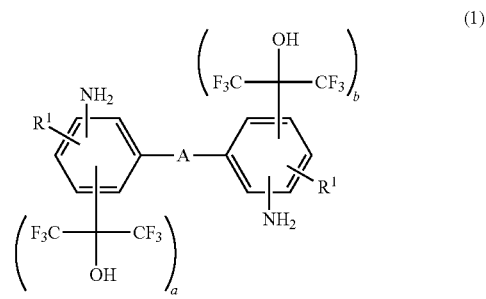

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, and each of "a" and "b" independently represents an integer of 0-2, and $1 \leq a+b \leq 4$.).

[Invention 2]

The diamine of Invention 1, represented by the general formula (2),

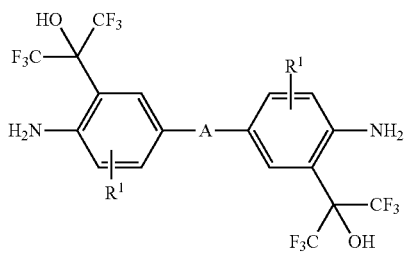

(2)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group.).

[Invention 3]

The diamine of Invention 2, represented by the general formula (3),

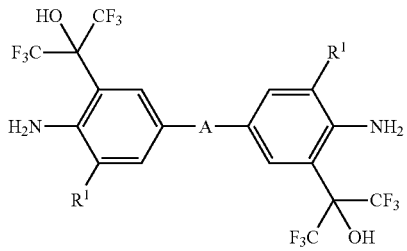

(3)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group.).

[Invention 4]

The diamine of Invention 2, represented by the general formula (4),

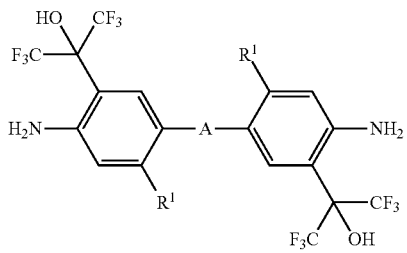

(4)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group.).

[Invention 5]

The diamine of Invention 3 or Invention 4, wherein A is a single bond or $CH_2$, and $R^1$ is a methyl group.

[Invention 6]

A method for producing a diamine represented by the general formula (1),

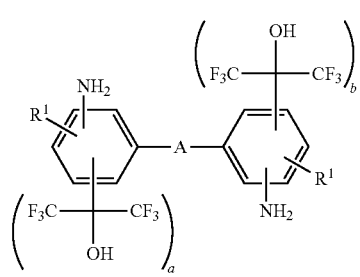

(1)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, and each of "a" and "b" independently represents an integer of 0-2, and $1 \leq a+b \leq 4$.)

the method comprising reacting a diamine represented by the general formula (5),

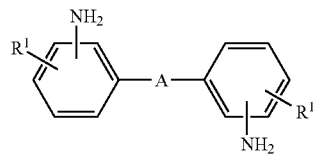

(5)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, and each of "a" and "b" independently represents an integer of 0-2, and $1 \leq a+b \leq 4$.)

with hexafluoroacetone or its hydrate.

[Invention 7]

A polyamic acid comprising a repeating unit represented by the general formula (6),

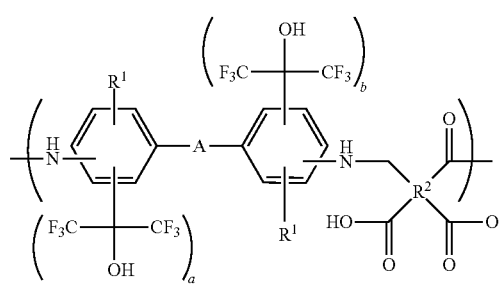

(6)

(In the formula, each A independently represents a single bond, an ether bond, a sulfide bond, CO, $CH_2$, SO, $SO_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$alkyl group or a halogen group, R$^2$ represents a tetravalent organic group containing at least one group selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and 1≤a+b≤4.).

[Invention 8]

The polyamic acid of Invention 7, comprising a repeating unit represented by the general formula (7),

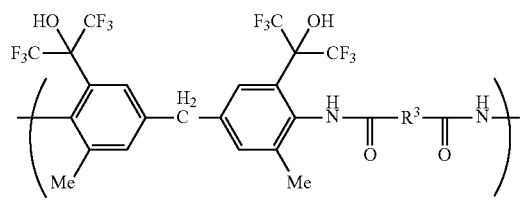

(7)

(In the formula, Me represents a methyl group, and each R$^3$ independently represents a bivalent group which is:

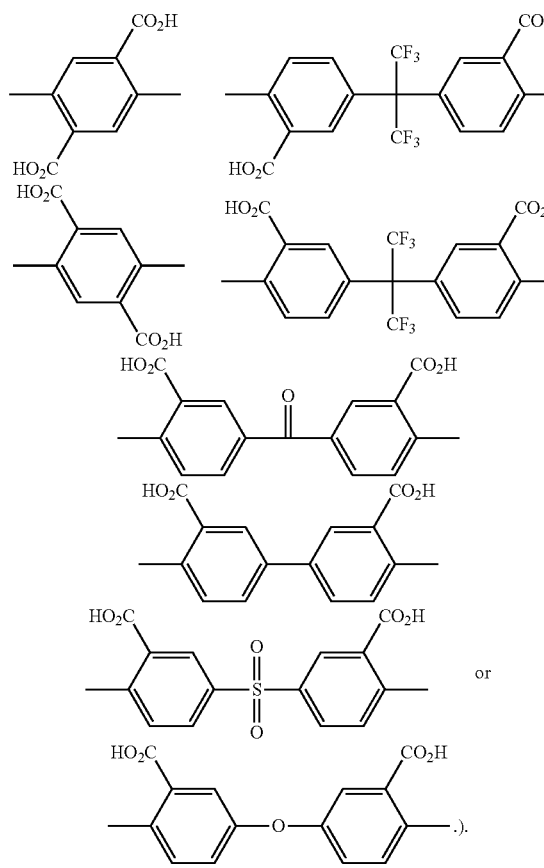

[Invention 9]

The polyamic acid of Invention 7, comprising a repeating unit represented by the general formula (8),

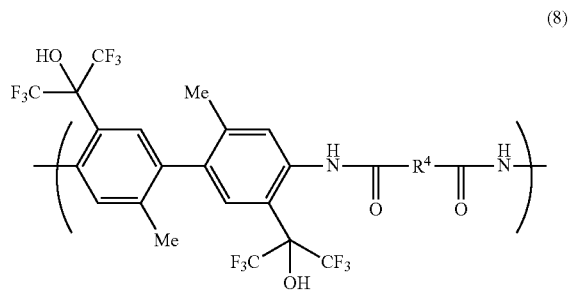

(8)

(In the formula, Me represents a methyl group, and R$^4$ represents:

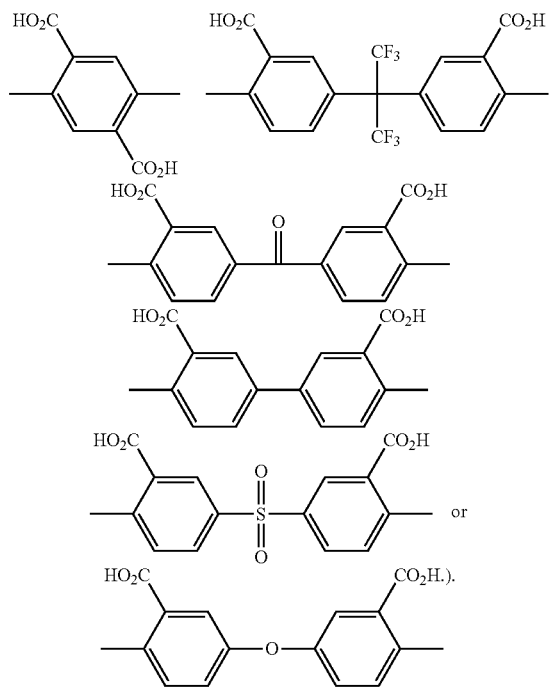

[Invention 10]

A polyimide comprising a repeating unit represented by the general formula (9),

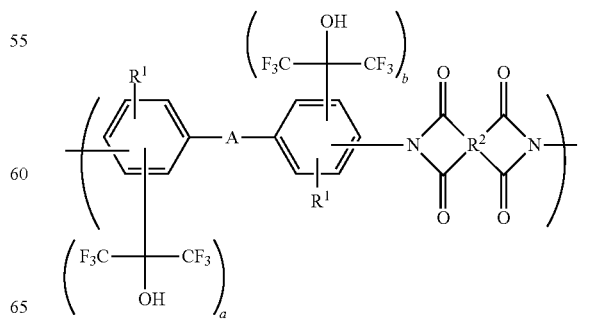

(9)

(In the formula, each A independently represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$alkyl group or a halogen group, R$^2$ represents a tetravalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and $1 \leq a+b \leq 4$.).

[Invention 11]

The polyimide of Invention 10, comprising a repeating unit represented by the general formula (10), (10)

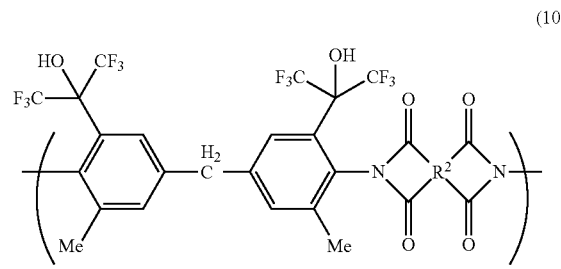

(In the formula, Me represents a methyl group, and R$^2$ represents:

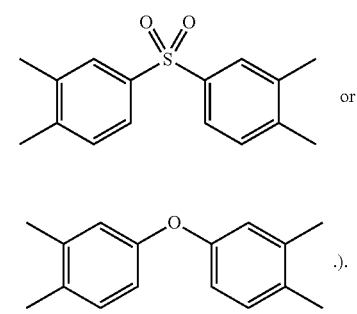 or

[Invention 12]

The polyimide of Invention 10, comprising a repeating unit represented by the general formula (11), (11)

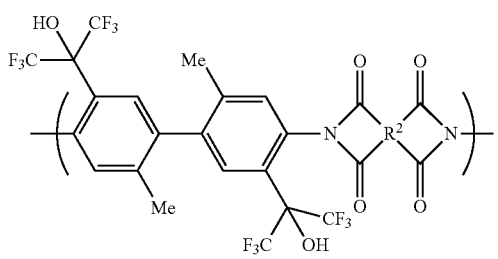

(In the formula, Me represents a methyl group, and R$^2$ represents:

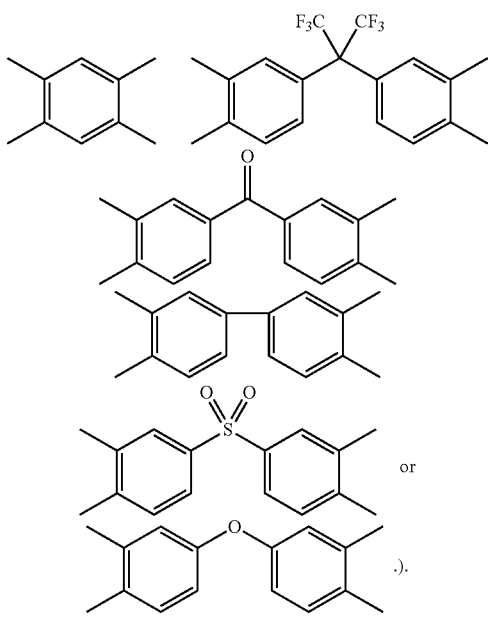

or

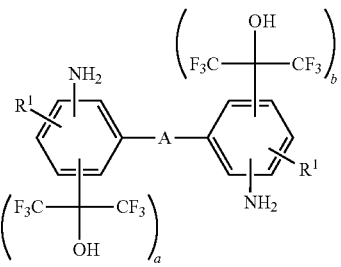 .).

[Invention 13]

A fluorescent material comprising any one of the polyimides of Inventions 10-12 and having a light emission quantum yield of 0.1% or greater.

[Invention 14]

A method for producing a polyimide, comprising:
polymerizing a diamine represented by the general formula (1), (1)

(In the formula, A represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$alkyl group or a halogen group, and each of "a" and "b" independently represents an integer of 0-2, and 1≤a+b≤4.)

with a tetracarboxylic dianhydride represented by the general formula (11),

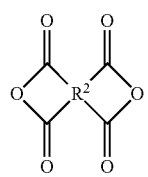
(11)

(In the formula, R$^2$ represents a tetravalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group.)

to produce a polyamic acid containing a repeating unit represented by the general formula (6), (6)

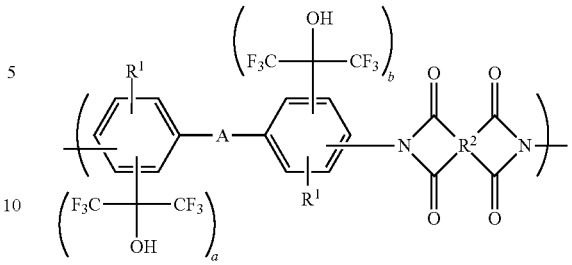
(9)

(In the formula, each A independently represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$ alkyl group or a halogen group, R$^2$ represents a tetravalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and 1≤a+b≤4.).

[Invention 15]

A polyamide comprising a repeating unit represented by the general formula (12), (12)

(In the formula, A represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$alkyl group or a halogen group, R$^2$ represents a tetravalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and 1≤a+b≤4.) and dehydrating the polyamic acid to obtain a polyimide containing a repeating unit represented by the general formula (9), (In the formula, A represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$alkyl group or a halogen group, R$^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and 1≤a+b≤4.).

[Invention 16]

A fluorescent material comprising the polyamide of Invention 15 and having a light emission quantum yield of 0.1% or greater.

[Invention 17]

A method for producing a polyamide containing a repeating unit represented by the general formula (12), (12)

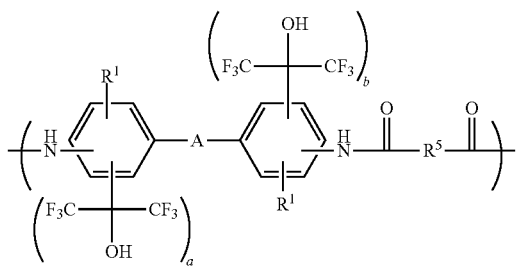

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, $R^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and $1 \leq a+b \leq 4$.)

by polycondensing a diamine represented by the general formula (1),

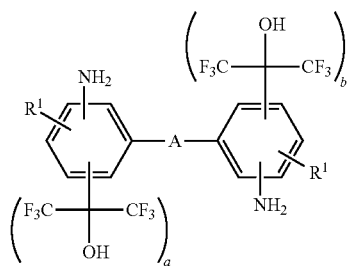

(1)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, and each of "a" and "b" independently represents an integer of 0-2, and $1 \leq a+b \leq 4$.)

with a dicarboxylic acid or a derivative thereof, represented by the general formula (13),

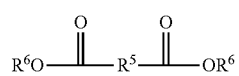

(13)

(In the formula, $R^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each $R^6$ independently represents at least one group selected from a hydrogen atom, a $C_{1-10}$ alkyl group or a benzyl group.)

or a dicarboxylic acid derivative represented by the general formula (14),

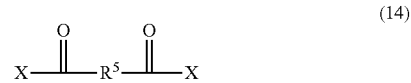

(14)

(In the formula, $R^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and X represents a halogen group.)

[Invention 18]

A polymer comprising a repeating unit represented by the general formula (15),

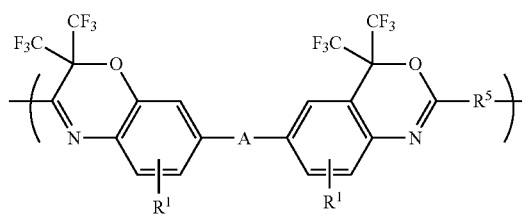

(15)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, $R^5$ represents a bivalent organic group containing at least one selected from the group consisting of an aliphatic ring, a heterocyclic ring, an aromatic ring, or a straight-chain or molecular chain aliphatic hydrocarbon group, and hydrogen atoms in the organic group may partially be replaced with alkyl group, fluoroalkyl group, carboxyl group, hydroxy group, cyano group or halogen group.)

[Invention 19]

A fluorescent material comprising the polymer of Invention 18 and having a light emission quantum yield of 0.1% or greater.

[Invention 20]

A method for producing a polymer represented by the general formula (15),

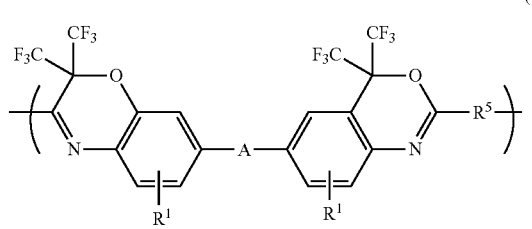

(15)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$alkyl group or a halogen group, $R^5$ represents a bivalent organic group containing at least one selected from the group consisting of an aliphatic ring, a heterocyclic ring, an aromatic ring, or a straight-chain or molecular chain aliphatic hydrocarbon group, and hydrogen atoms in the organic group may partially be replaced with alkyl group, fluoroalkyl group, carboxyl group, hydroxy group, cyano group or halogen group.)
the method comprising conducting a cyclocondensation of a polyamide containing a repeating unit represented by the general formula (12),

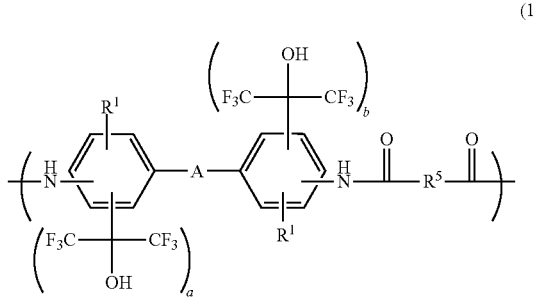

(12)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, $R^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and $1 \leq a+b \leq 4$.)

ADVANTAGEOUS EFFECT OF THE INVENTION

The present invention's polyimide or polyamide, formed by a polymerization using, as a raw material compound, a diamine containing a hexafluoroisopropanol group and an alkyl group or halogen group, or a polymer formed by a cyclization of an amide moiety of the polyamide is soluble in organic solvents and has a heat resistance making it usable as an organic light-emitting device and a strength to the extent that an independent film can be obtained when formed into a film. Furthermore, one showing fluorescent characteristics can be used as an organic light-emitting device for optical devices, etc.

DETAILED DESCRIPTION

In the following, the present invention is described in detail.

In the present invention, hexafluoroisopropanol group (1,1,1,3,3,3-hexafluoro-2-hydroxy-2-propyl group) is represented by a chemical formula of $—C(CF_3)_2OH$. In the following, it may be referred to as HFIP group. A hexafluoroisopropanol group-containing polyimide may be referred to as a HFIP group-containing polyimide. A hexafluoroisopropanol group-containing polyamide may be referred to as a HFIP group-containing polyamide. In the present invention, halogen group refers to fluoro group, chloro group, bromo group, or iodo group.

1. HFIP Group-Containing Diamine
[HFIP Group-Containing Diamine Represented by the General Formula (1)]

The present invention provides a HFIP group-containing diamine represented by the general formula (1).

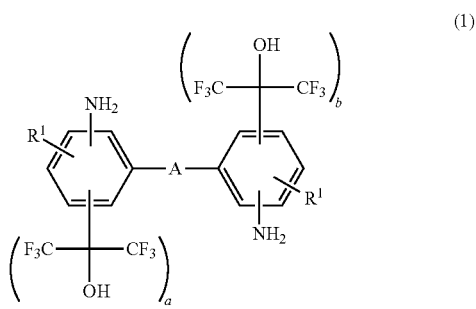

(1)

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$alkyl group or a halogen group, and each of "a" and "b" independently represents an integer of 0-2, and $1 \leq a+b \leq 4$.).

The $C_{1-4}$alkyl group is exemplified by methyl group (—$CH_3$, in the following it may be represented by -Me), ethyl group (—$C_2H_5$, in the following it may be represented by -Et), n-propyl group (—$C_3H_7$), isopropyl group (—CH($CH_3)_2$), n-butyl group (-n$C_4H_9$), and tertiary butyl group (-t$C_4H_9$). It is preferable to be methyl group or ethyl group.

In the HFIP group-containing diamine represented by the general formula (1), the synthesis becomes easy if a and b are 1. Specifically, it is preferable to be HFIP group-containing diamine represented by the following general formula (2).

[HFIP Group-Containing Diamine Represented by the General Formula (2)]

It is HFIP group-containing diamine represented by

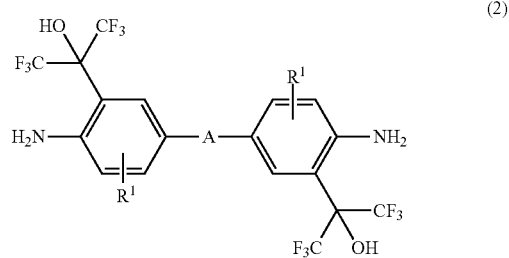

(2)

(In the formula, A and $R^1$ are the same as those of the general formula (1).).

Furthermore, specifically, HFIP group-containing diamine represented by the following general formula (3) or the general formula (4) is preferable, since the synthesis is easy.

[HFIP Group-Containing Diamine Represented by the General Formula (3)]
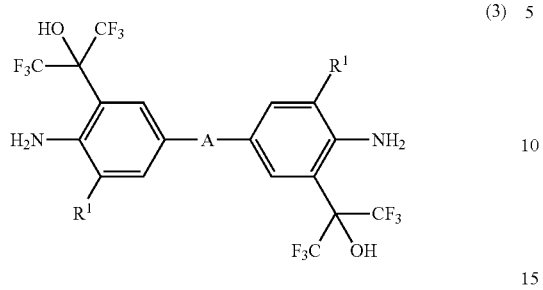
(3)
(In the formula, A and $R^1$ are the same as those of the general formula (1).)
[Exemplification of HFIP Group-Containing Diamine Represented by the General Formula (3)]
HFIP group-containing diamine represented by the general formula (3) can be exemplified by the following compounds.
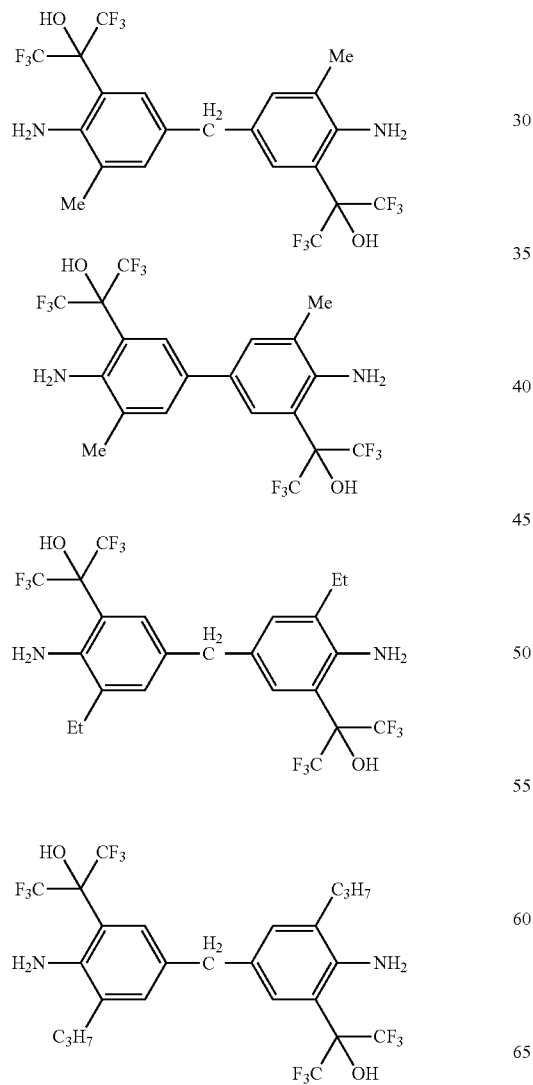
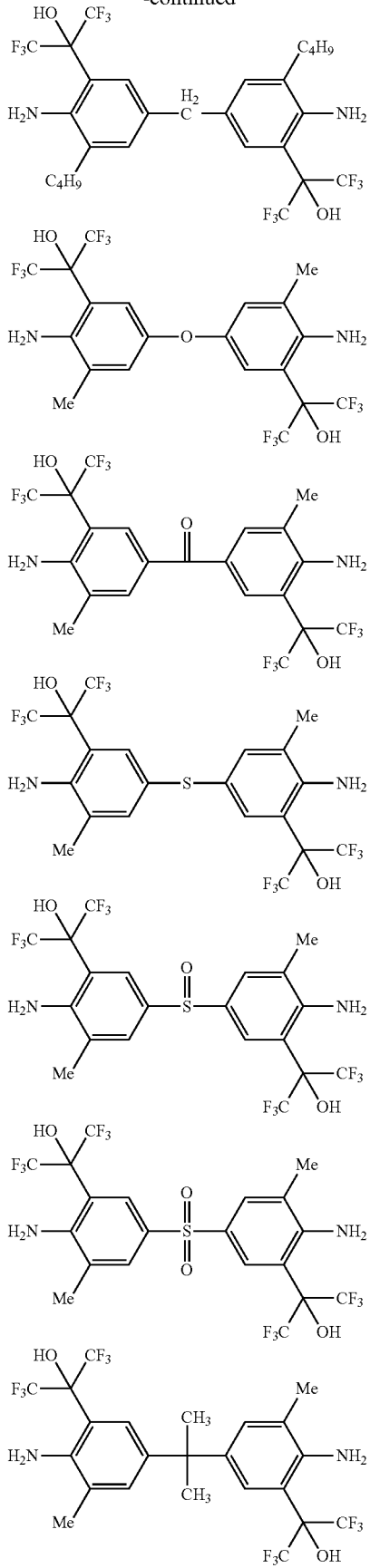

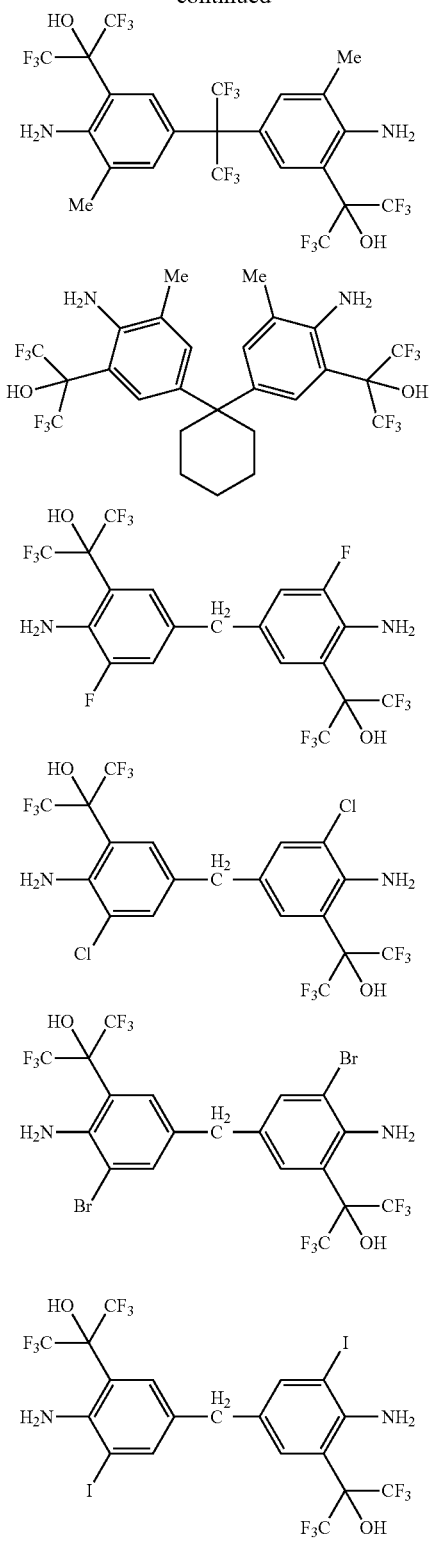

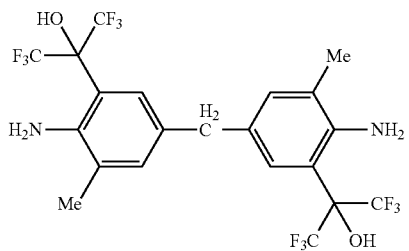

Bis(4-amino-3-(1,1,1,3,3,3-hexafluoro-2-hydroxy-2-propyl)-5-methylphenyl)methane

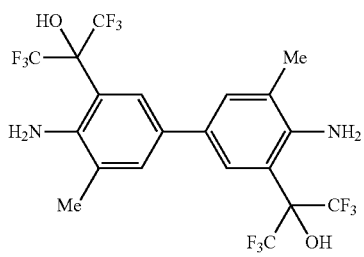 [SMILES: Cc1cc(-c2cc(C)c(N)c(C(O)(C(F)(F)F)C(F)(F)F)c2)cc(C(O)(C(F)(F)F)C(F)(F)F)c1N]

3,3'-bis(1,1,1,3,3,3-hexafluoro-2-hydroxy-2-propyl)-5,5'-dimethylbenzidine

Furthermore, it is possible to obtain a light emission quantum yield of 0.1% or greater in HFIP group-containing polyimides, HFIP group-containing polyamides, or HFIP group-containing polymers formed by a cyclization of an amide moiety of the HFIP group-containing polyamides, which are obtained from these HFIP-group containing diamines.

[HFIP Group-Containing Diamine Represented by the General Formula (4)]

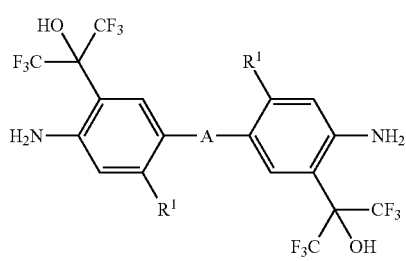

(4)

(In the formula, A and $R^1$ are the same as those of the general formula (1).)

[Exemplification of HFIP Group-Containing Diamine Represented by the General Formula (4)]

In particular, the HFIP group-containing diamine represented by the general formula (3) is preferably one in which A is a single bond or $CH_2$, and $R^1$ is methyl group, which is easily synthesized. In the present invention, it is preferable to use particularly the following HFIP group-containing diamines.

The HFIP group-containing diamine represented by the general formula (4) can be exemplified by the following compounds.

-continued
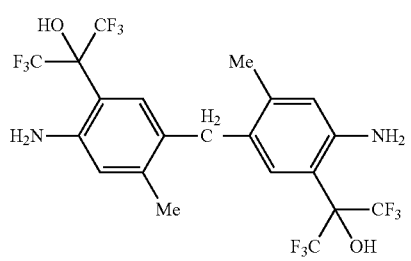
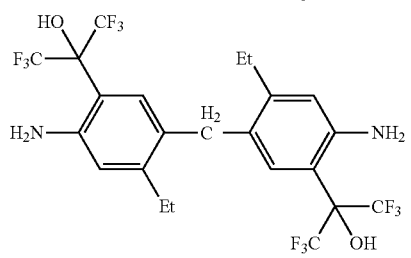
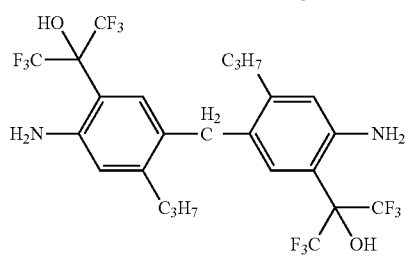
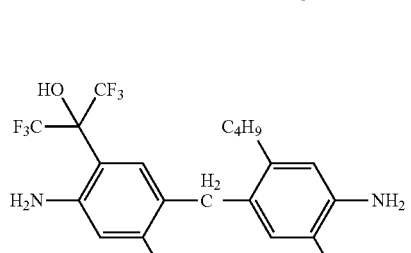
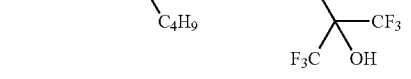
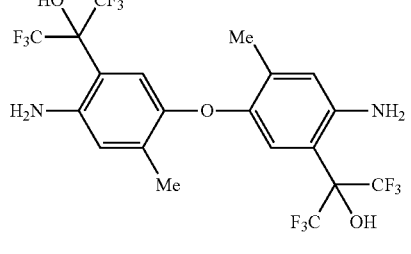
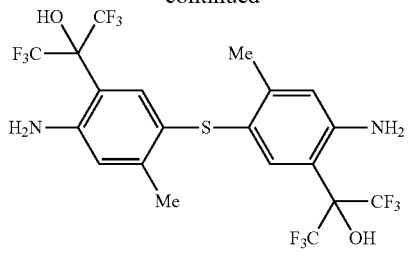
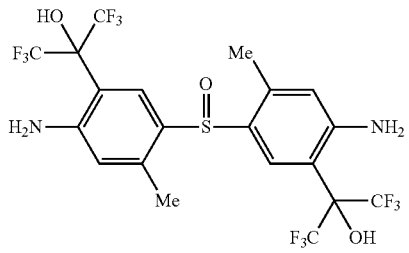
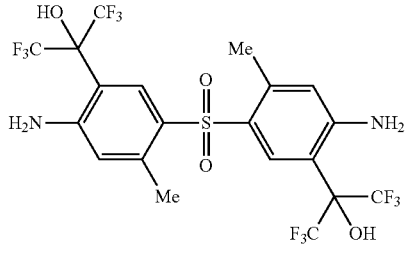
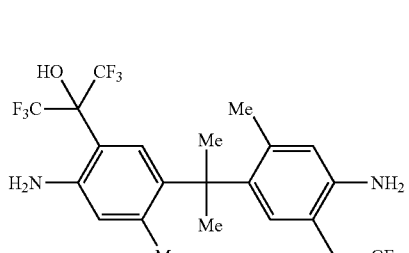
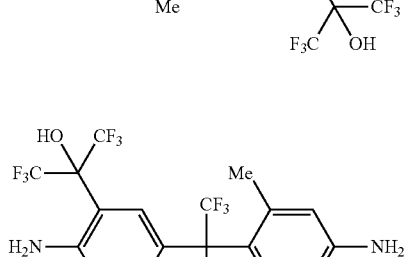
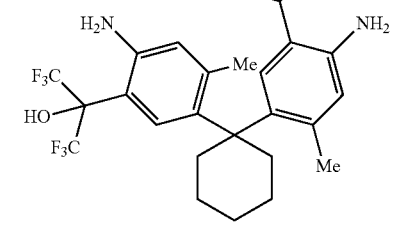

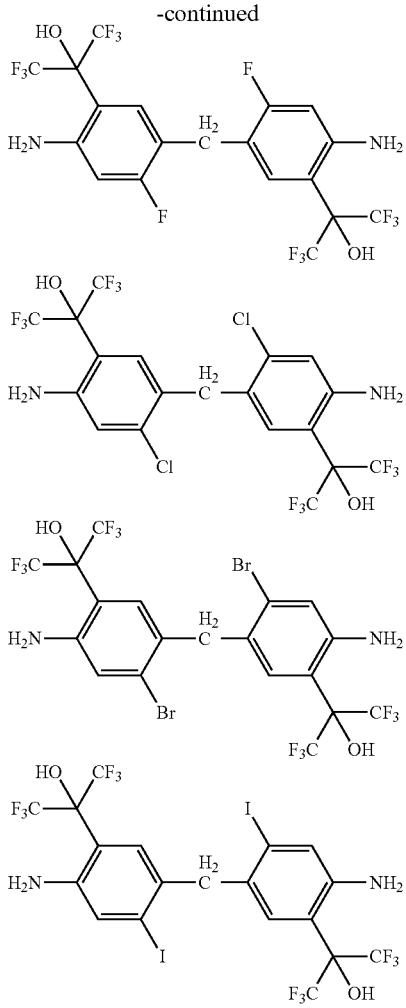

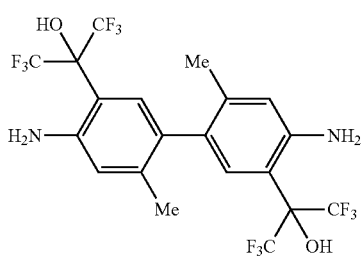 [SMILES: Cc1cc(N)c(C(O)(C(F)(F)F)C(F)(F)F)cc1-c1cc(C(O)(C(F)(F)F)C(F)(F)F)c(N)cc1C]

5,5'-bis(1,1,1,3,3,3-hexafluoro-2-hydroxy-2-propyl)-2,2'-dimethylbenzidine

2. Method for Producing HFIP Group-Containing Diamine
[Synthesis of HFIP Group-Containing Diamine Represented by the General Formula (1)]

There is explained a method for producing HFIP group-containing diamine represented by the general formula (1),

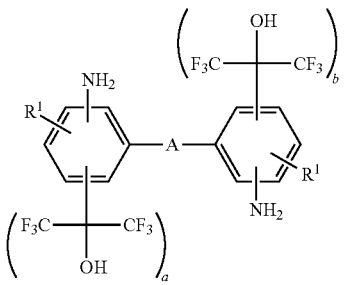

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, and each of "a" and "b" independently represents an integer of 0-2, and $1 \leq a+b \leq 4$.).

As shown in the following formula, it can be obtained by reacting a diamine represented by the formula (5) as a raw material compound with hexafluoroacetone or hexafluoroacetone trihydrate.

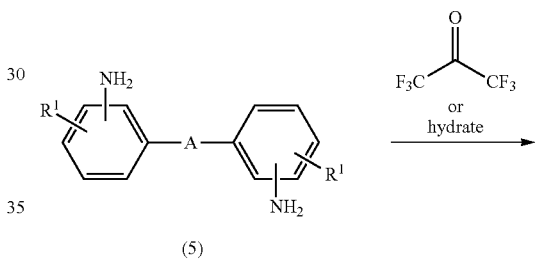

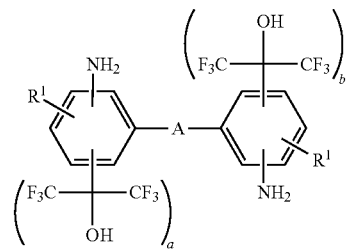

The amount of hexafluoroacetone or hexafluoroacetone trihydrate used in the present reaction is preferably 2 mol to 10 mol, more preferably 2.5 mol to 5 mol, relative to 1 mol of the diamine represented by the general formula (5) as the raw material compound. If it is less than 2 mol, yield of the diamine represented by the general formula (1) as the target compound is low. Although the reaction progresses even by using it in an amount of greater than 10 mol, this using is not necessary.

The present reaction is conducted normally in a range of 20° C. to 180° C., preferably 50° C. to 150° C., particularly preferably 90° C. to 140° C. Being lower than 20° C. is not preferable, since it is difficult to progress the reaction.

Although it is possible to conduct the present reaction without using catalyst, it is preferable to accelerate the reaction by using an acid catalyst. The acid catalyst to be used can be exemplified by Lewis acids, such as aluminum chloride, iron (III) chloride and boron fluoride, and organic sulfonic acids, such as benzenesulfonic acid, camphorsulfonic acid (CAS), methanesulfonic acid, p-toluenesulfonic acid (pTsOH), p-toluenesulfonic acid monohydrate (pTsOH.H₂O) or pyridinium p-toluenesulfonate (PPTS). In terms of mol % relative to the diamine represented by the general formula (5) as the raw material compound, the amount of the catalyst is preferably 1 mol % to 50 mol %, more preferably 3 mol % to 40 mol %. If it is less than 1 mol %, the reaction does not progress. The use of greater than 50 mol % is not necessary.

In the present reaction, it is possible to conduct the reaction without using solvent, but it is also possible to use solvent. The solvent to be used is not particularly limited as long as it is not involved in the reaction. It is possible to use aromatic hydrocarbon solvents, such as benzene, toluene, xylene, nitrobenzene or benzonitrile, or water. The amount of the solvent to be used is not particularly limited.

In the case of conducting the present reaction in a sealed reaction container such as autoclave, the operation is different depending on using hexafluoroacetone or hexafluoroacetone trihydrate. In the case of using hexafluoroacetone, the reaction container is firstly charged with HFIP group-containing diamine represented by the general formula (5) and according to need acid catalyst and solvent. Then, while increasing the temperature in a manner that the inside pressure of the reaction container does not exceed a predetermined pressure, the reaction is conducted by gradually adding hexafluoroacetone to obtain HFIP group-containing diamine represented by the general formula (1).

In the case of using hexafluoroacetone trihydrate, it is possible to charge the reaction container firstly with HFIP group-containing diamine represented by the general formula (5) and hexafluoroacetone trihydrate in the necessary amount. Furthermore, according to need, the reaction container is charged with acid catalyst and solvent to conduct the reaction, thereby obtaining HFIP group-containing diamine represented by the general formula (1).

The reaction time of the present reaction is preferably from 8 hours to 48 hours. In this range, a preferable reaction time is different depending on the temperature, the amount of solvent to be used, and the like. Therefore, it is preferable to conduct the reaction while checking the progress of the reaction by an analytical means such as gas chromatography and then terminate the reaction after confirming that the raw material compound was sufficiently consumed in the reaction. After terminating the reaction, it is possible to obtain the diamine represented by the general formula (1) by a means such as extraction, distillation or precipitation. Furthermore, according to need, it can also be purified by column chromatography or recrystallization, etc.

3. HFIP Group-Containing Polyamic Acid.

Using the above-mentioned HFIP group-containing diamine of the present invention, it is reacted with tetracarboxylic acid. With this, it is possible to synthesize HFIP group-containing polyamic acid of the present invention.

The present invention provides HFIP group-containing polyamic acid of Invention 7, containing a repeating unit represented by the general formula (6),

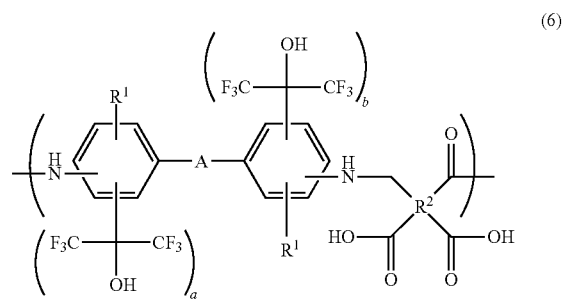

(In the formula, each A independently represents a single bond, an ether bond, a sulfide bond, CO, CH₂, SO, SO₂, C(CH₃)₂, NHCO or C(CF₃)₂, or a bivalent group having an aliphatic ring, a hetero ring or an aromatic ring, each $R^1$ independently represents a $C_{1-4}$alkyl group or a halogen group, $R^2$ represents a tetravalent organic group containing at least one group selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and 1≤a+b≤4.).

Furthermore, the present invention provides HFIP group-containing polyamic acid of Invention 8, containing a repeating unit represented by the general formula (7),

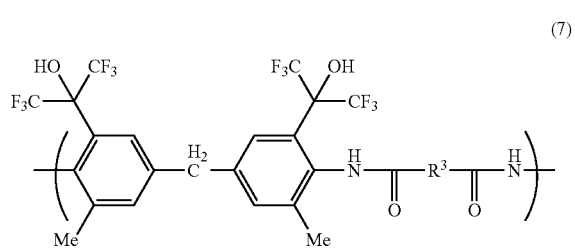

(In the formula, Me represents a methyl group, and each $R^3$ independently represents a bivalent group which is:

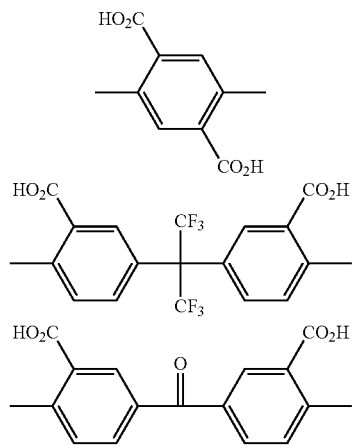

27
-continued
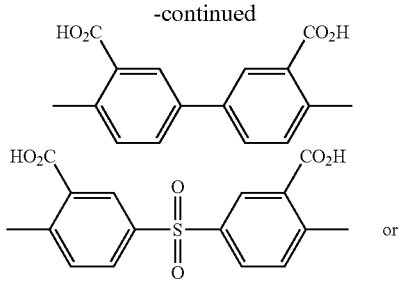
or
28
-continued
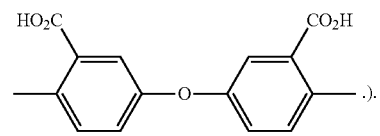
.).
As HFIP group-containing polyamic acid of Invention 8, specifically, it is possible to cite compounds containing the following repeating units.
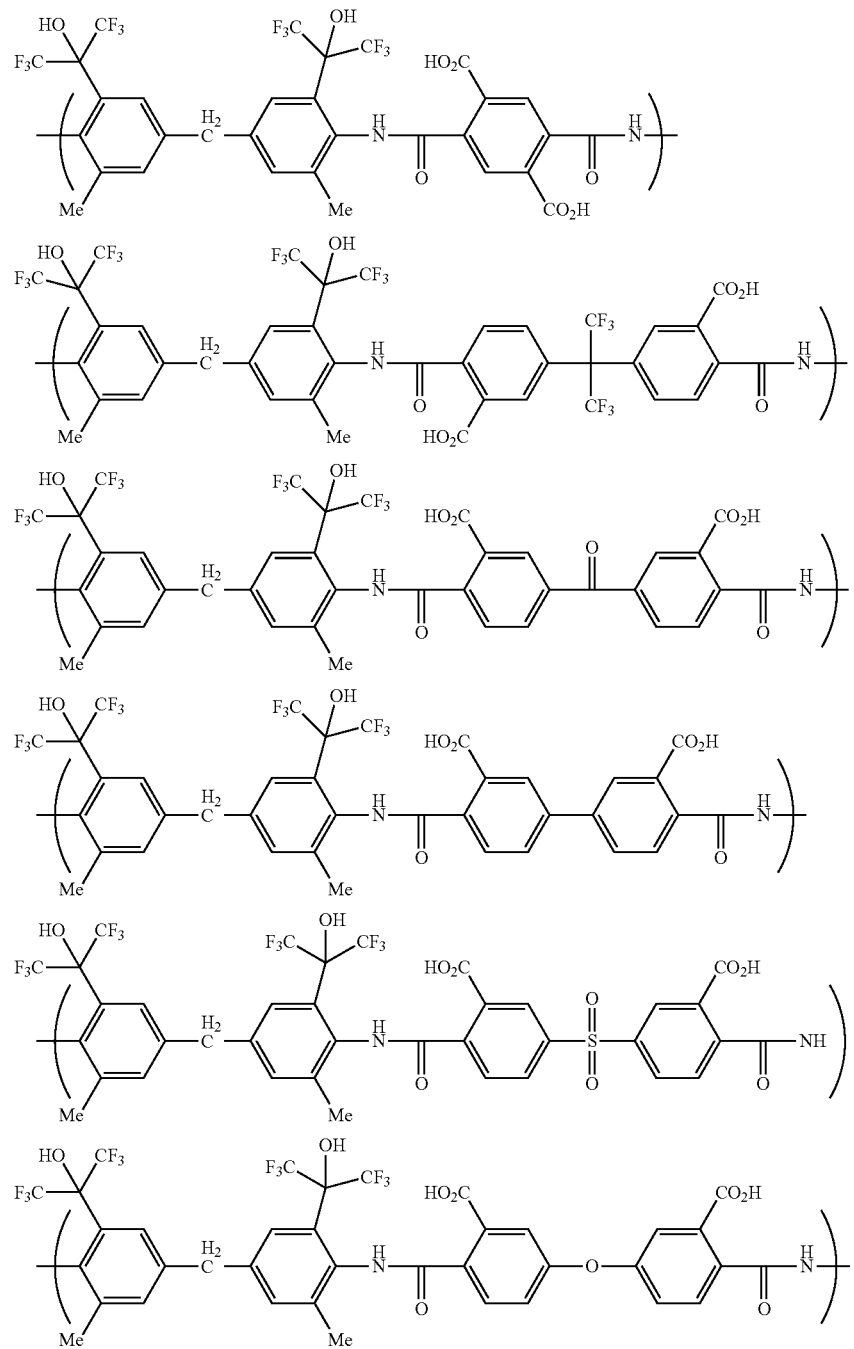

Furthermore, the present invention provides HFIP group-containing polyamic acid of Invention 9, containing a repeating unit represented by the general formula (8),

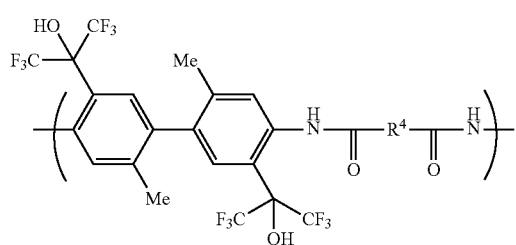
(8)

(In the formula, Me represents methyl group, and $R^4$ represents:

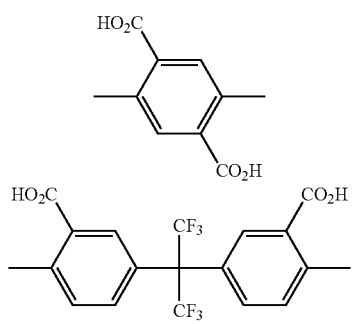

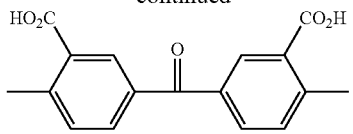

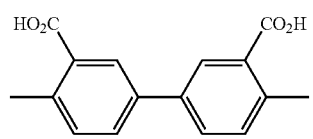

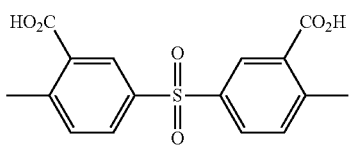

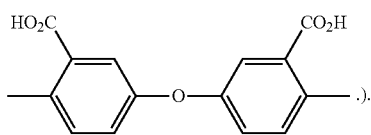

or .).

As HFIP group-containing polyamic acid of Invention 9, specifically, it is possible to cite compounds containing the following repeating units.

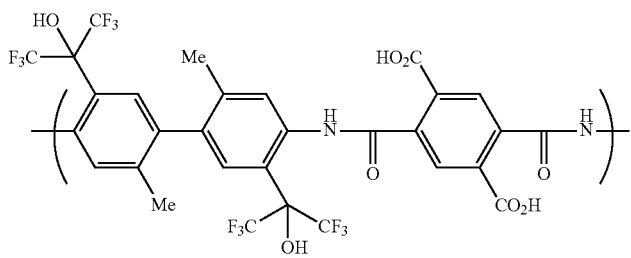

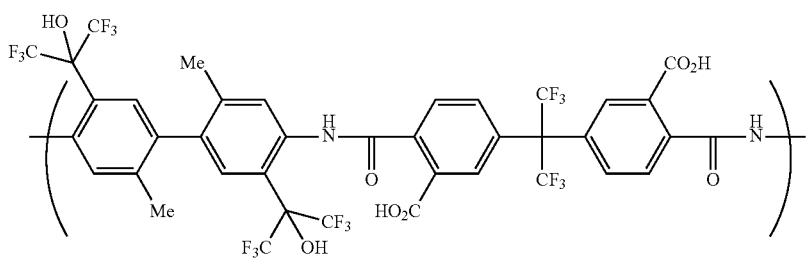

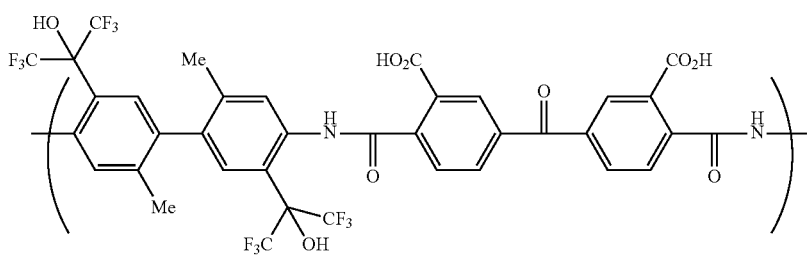

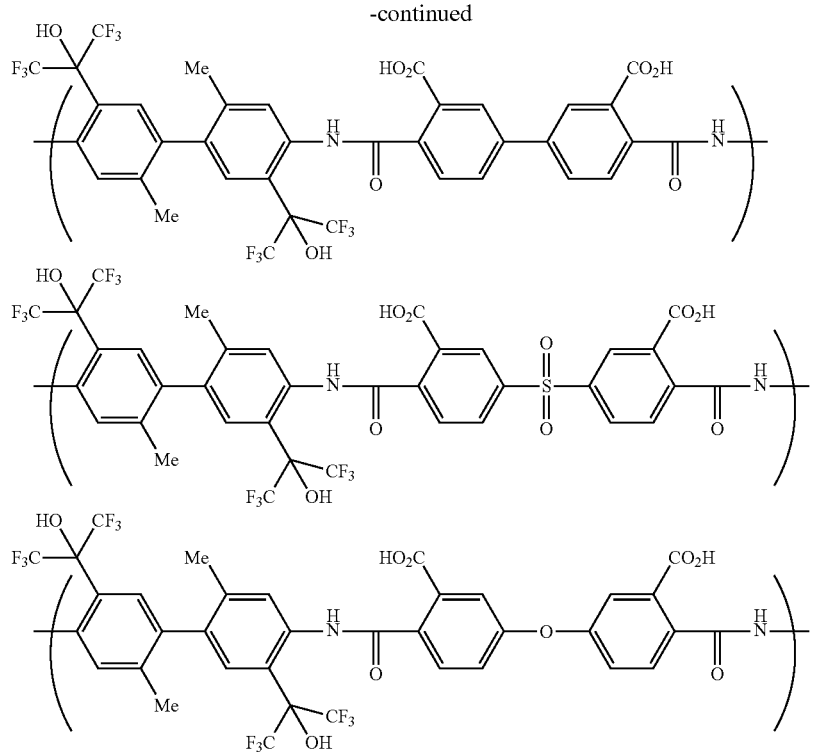

It is preferable that HFIP group-containing polyamic acid of the present invention has a weight average molecular weight (Mw) of from 10000 to 500000, based on polystyrene. If Mw is less than 10000, HFIP group-containing polyimide to be obtained is low in strength, and it is difficult to make an independent film. If it is greater than 500000, HFIP group-containing polyimide to be obtained is inferior in solubility. Particularly preferably, it is from 50000 to 150000.

It is possible to obtain HFIP group-containing polyimide of the present invention by an imidization of the above HFIP group-containing polyamic acid.

The present invention provides HFIP group-containing polyimide of Invention 10, containing a repeating unit represented by the general formula (9),

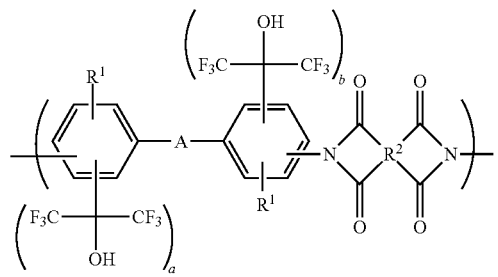

(9)

(In the formula, each A independently represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$alkyl group or a halogen group, R$^2$ represents a tetravalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and 1≤a+b≤4.).

Furthermore, the present invention provides HFIP group-containing polyimide of Invention 11, containing a repeating unit represented by the general formula (10),

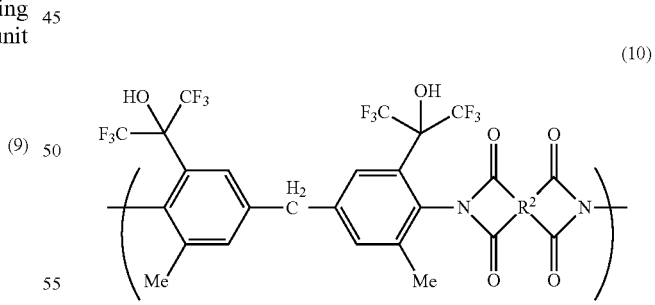

(10)

(In the formula, Me represents methyl group, and R$^2$ represents:

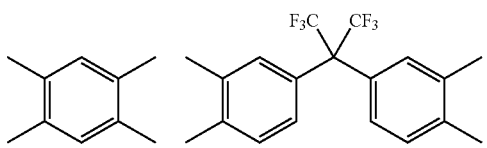

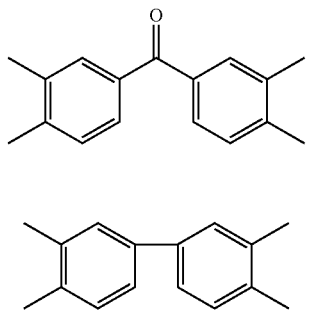
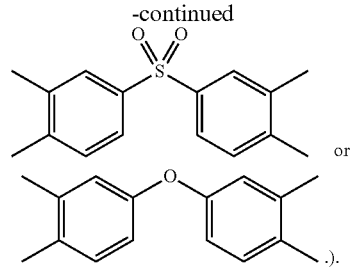
As HFIP group-containing polyimide of Invention 11, specifically, it is possible to cite compounds containing the following repeating units.
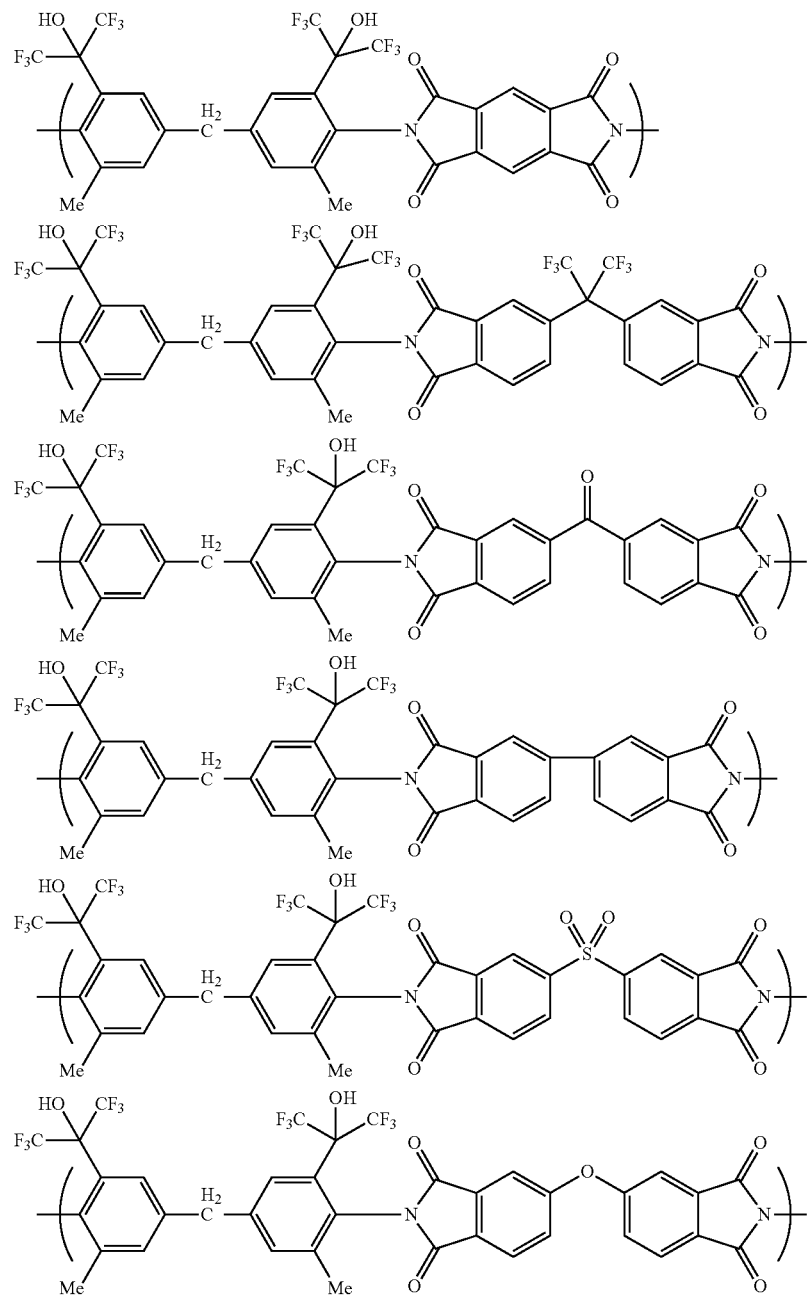

Furthermore, the present invention provides HFIP group-containing polyimide of Invention 12, containing a repeating unit represented by the general formula (11),
(11)
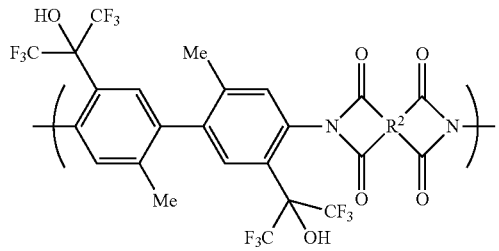
(In the formula, Me represents methyl group, and R² represents:
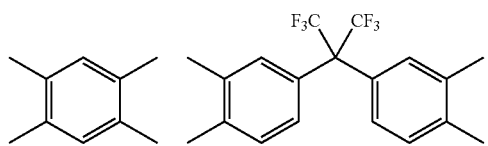
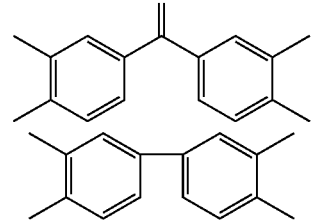
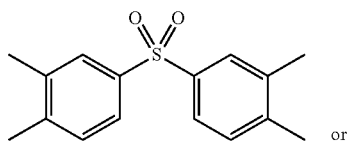
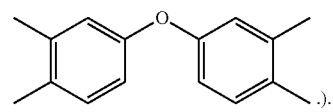 or
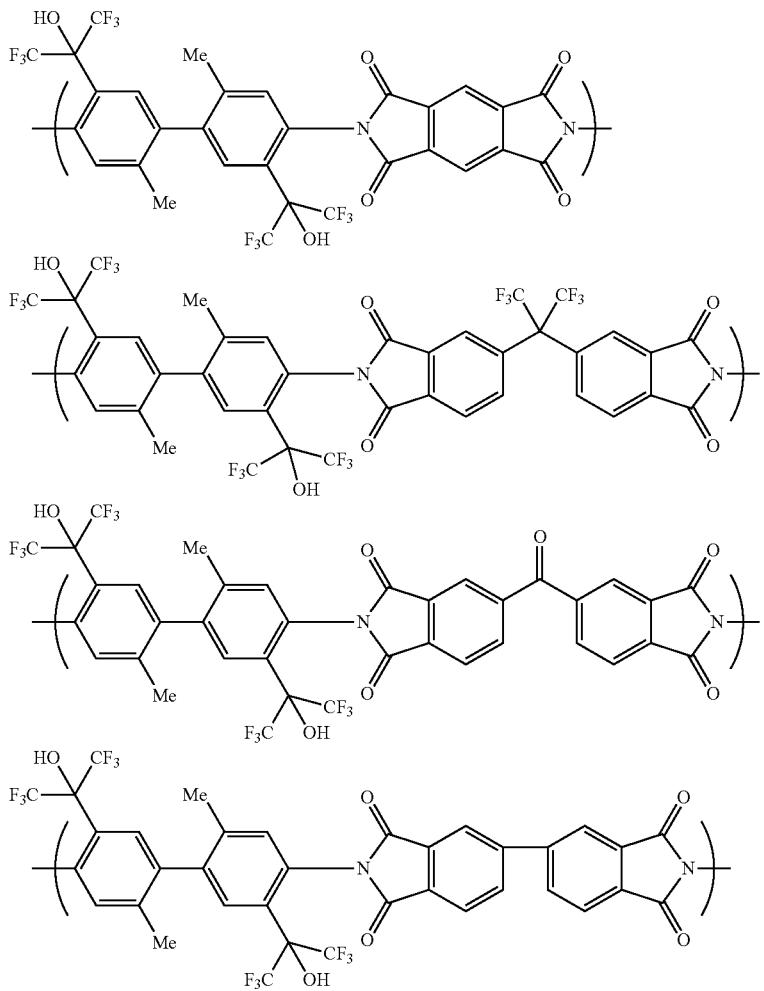
.).
HFIP group-containing polyimide of Invention 12 is specifically HFIP group-containing polyimide containing the following repeating unit.

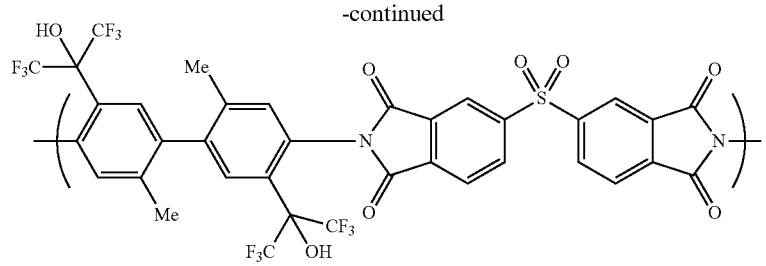

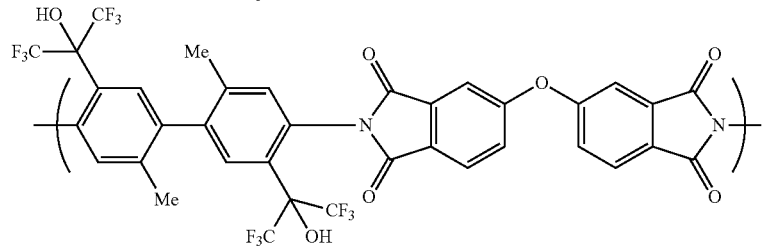

It is preferable that HFIP group-containing polyimide of the present invention has a weight average molecular weight (Mw) of from 10000 to 500000, based on polystyrene. If Mw is less than 10000, HFIP group-containing polyimide is low in strength, and it is difficult to make an independent film. If it is greater than 500000, HFIP group-containing polyimide is inferior in solubility. Particularly preferably, it is from 50000 to 150000.

4. Method for Producing HFIP Group-Containing Polyimide

The present invention provides a method for producing HFIP group-containing polyimide of Invention 14, comprising:

polycondensing a HFIP group-containing diamine represented by the general formula (1),

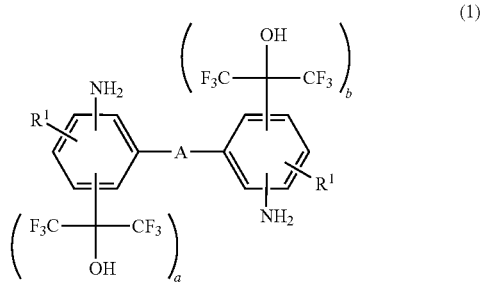

(1)

(In the formula, A represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, R$^1$ represents a C$_{1-4}$alkyl group or a halogen group, and each of "a" and "b" independently represents an integer of 0-2, and 1≤a+b≤4.) with a tetracarboxylic dianhydride represented by the general formula (11),

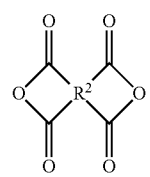

(11)

(In the formula, R$^2$ represents a tetravalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group.)

to produce a polyamic acid containing a repeating unit represented by the general formula (6),

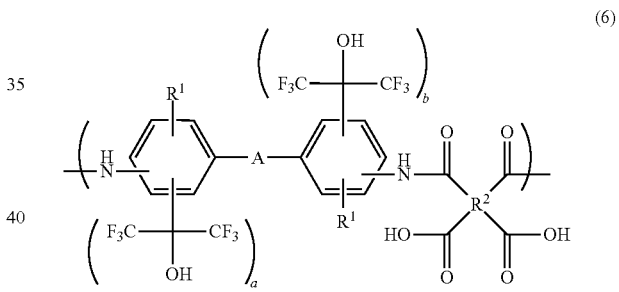

(6)

(In the formula, A, R$^1$ and R$^2$ are the same as those of the formula (1) and the formula (11), each of "a" and "b" independently represents an integer of 0-2, and 1≤a+b≤4.) and dehydrating the polyamic acid to obtain an HFIP group-containing polyimide containing a repeating unit represented by the general formula (9),

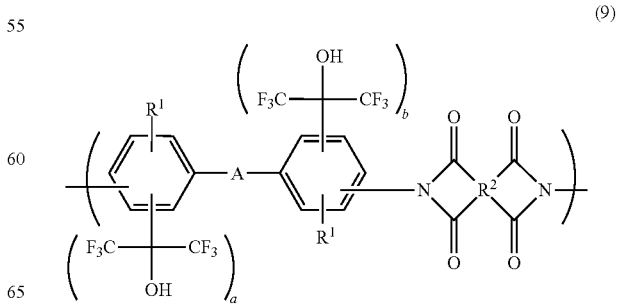

(9)

(In the formula, A, $R^1$ and $R^2$ are the same as those of the formula (1), the formula (6) and the formula (11), each of "a" and "b" independently represents an integer of 0-2, and $1 \leq a+b \leq 4$.).

That is, HFIP group-containing diamine of Inventions 1-5 is reacted with tetracarboxylic dianhydride represented by the general formula (11), thereby obtaining HFIP group-containing polyamic acid of Inventions 7-9. HFIP group-containing polyamic acid of Inventions 7-9 is subjected to imidization, thereby obtaining HFIP group-containing polyimide of Inventions 10-12.

For example, as shown in the following formula, it is possible to obtain HFIP group-containing polyamic acid of the present invention by reacting bis(4-amino-3-(1,1,1,3,3,3-hexafluoro-2-hydroxy-2-propyl)-5-methylphenyl)methane of the present invention with pyromellitic anhydride in dimethylacetamide (in the following, it may be referred to as DMAc)

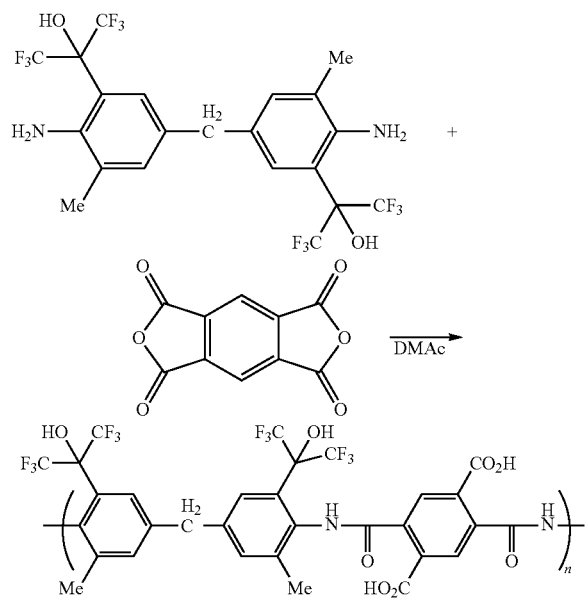

Tetracarboxylic dianhydride represented by the general formula (11) can be used without particular limitations, as long as it is one that is generally known as a raw material compound of polyamic acid or polyimide.

As such tetracarboxylic dianhydride, it is possible to cite benzenetetracarboxylic dianhydride (pyromellitic dianhydride) (in the following, it may be referred to as PMDA), trifluoromethylbenzenetetracarboxylic dianhydride, bistrifluoromethylbenzenetetracarboxylic dianhydride, difluorobenzenetetracarboxylic dianhydride, naphthalenetetracarboxylic dianhydride, biphenyltetracarboxylic dianhydride (in the following, it may be referred to as BPDA), terphenyltetracarboxylic dianhydride, 1,1-bis(3,4-dicarboxyphenyl)ketonic dianhydride (in the following, it may be referred to as BTDA), oxydiphthalic dianhydride (in the following, abbreviated as ODPA), bicyclo(2,2,2)oct-7-ene-2,3,5,6-tetracarboxylic dianhydride, 2,2-bis(3,4-dicarboxyphenyl)hexafluoropropanoic dianhydride (in the following, it may be referred to as 6FDA), 2,3,4,5-thiophenetetracarboxylic dianhydride, 2,2',5,5',6,6'-hexafluoro-3,3',4,4'-biphenyltetracarboxylic dianhydride, bis(3,4-dicarboxyphenyl)sulfonic dianhydride (in the following, it may be referred to as DSDA), or 3,4,9,10-perylenetetracarboxylic dianhydride. It is optional to use at least two of these tetracarboxylic dianhydrides at the same time. In particular, it is preferable to use PMDA, BPDA, 6FDA, BTDA, ODPA, and DSDA, since they are easily available, superior in heat resistance, and easily soluble in solvents.

It is possible to conduct a polymerization from HFIP group-containing diamine and tetracarboxylic dianhydride represented by the general formula (11) to give HFIP group-containing polyamic acid. For example, it is possible to cite a method by reacting the HFIP group-containing diamine with tetracarboxylic dianhydride in an organic solvent at a temperature of from −20° C. to 80° C.

The organic solvent to be used is acceptable as long as the HFIP group-containing diamine and tetracarboxylic dianhydride are soluble therein. It can be exemplified by amide-series solvents such as N,N-dimethylformamide, N,N-dimethylacetamide, N-methylformamide, hexamethylphosphoric triamide, and N-methyl-2-pyrrolidone; aromatic solvents such as benzene, anisole, diphenyl ether, nitrobenzene, or benzonitrile; halogen-series solvents such as chloroform, dichloromethane, 1,2-dichloroethane, or 1,1,2,2-tetrachloroethane; or lactone-series solvents such as γ-butyrolactone, γ-valerolactone, γ-caprolactone, ε-caprolactone, or α-methyl-γ-butyrolactone. It is possible to obtain a polyamic acid having a high degree of polymerization by conducting the reaction under the coexistence of an acid acceptor, such as pyridine or triethylamine, together with the above-mentioned amide-series solvent.

It is optional to make a copolymer with a polyamic acid by using together HFIP group-containing diamine of the present invention and another HFIP group-free diamine, dihydroxydiamine. The diamine compound usable therewith can be exemplified by 3,5-diaminobenzotrifluoride, 2,5-diaminobenzotrifluoride, 3,3'-bistrifluoromethyl-4,4'-diaminobiphenyl, bis(trifluoromethyl)-4,4'-diaminodiphenyl, bis(fluorinated alkyl)-4,4'-diaminodiphenyl, dichloro-4,4'-diaminodiphenyl, dibromo-4,4'-diaminodiphenyl, bis(fluorinated alkoxy)-4,4'-diaminodiphenyl, diphenyl-4,4'-diaminodiphenyl, 4,4'-bis(4-aminotetrafluorophenoxy)tetrafluorobenzene, 4,4'-bis(4-aminotetrafluorophenoxy)octafluorobiphenyl, 4,4'-binaphthylamine, o-, m- and p-phenylenediamine, 2,4-diaminotoluene, 2,5-diaminotoluene, 2,4-diaminoxylene, 2,4-diaminoxylene, 2,4-diaminodiurene, dimethyl-4,4'-diaminodiphenyl, dialkyl-4,4'-diaminodiphenyl, dimethoxy-4,4'-diaminodiphenyl, diethoxy-4,4'-diaminodiphenyl, 4,4'-diaminodiphenylmethane, 4,4'-diaminodiphenyl ether, 4,4'-diaminodiphenyl sulfone, 4,4'-diaminobenzophenone, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(3-aminophenoxy)phenyl)sulfone, bis(4-(4-aminophenoxy)phenyl)sulfone, 2,2-bis(4-(4-aminophenoxy)phenyl)propane, 2,2-bis(4-(4-aminophenoxy)phenyl)hexafluoropropane, 2,2-bis(4-(3-aminophenoxy)phenyl)propane, 2,2-bis(4-(3-aminophenoxy)phenyl)hexafluoropropane, 2,2-bis(4-(4-aminophenyl)hexafluoropropane, 2,2-bis(4-aminophenyl)hexafluoropropane, 2,2-bis(3-aminophenyl)hexafluoropropane, 2,2-bis(3-amino-4-hydroxyphenyl)hexafluoropropane, 2,2-bis(3-amino-4-methylphenyl)hexafluoropropane, 4,4'-bis(4-aminophenoxy)octafluorobiphenyl, or 4,4'-diaminobenzanilide. It is optional to use at least two of these HFIP group-free diamines together.

Dehydration occurs in the compound of the above-mentioned HFIP group-containing polyamic acid represented by the general formula (6) by a heating treatment or a reaction with a dehydration reagent to form an imide ring. With this, it is possible to synthesize HFIP group-containing polyimide represented by the general formula (9). In the case of conducting an imidization through dehydration in the polyamic acid by the heating treatment, an imide ring is formed at a reaction temperature of from 80° C. to 350° C. With this, it is possible to synthesize HFIP group-containing polyimide represented by the general formula (9). It is preferably 150° C. or higher, more preferably 200° C. or higher. In case that the reaction temperature is lower than 80° C., there is a risk that the film strength is impaired or water absorption becomes high when forming the polyimide into a coating film, due to the degree of imidization being insufficient. On the other hand, in case that the reaction temperature exceeds 350° C., there is a risk that the film strength is impaired or it is stained when forming the polyimide into a coating film, due to pyrolysis of a part of the polyimide or the like. Furthermore, in the case of conducting the imidization through dehydration in the polyamic acid by using a dehydration reagent, it is also possible to synthesize the polyimide by adding acetic anhydride as a dehydration reagent and furthermore adding a base such as pyridine or triethylamine to conduct a reaction with the polyamic acid and a dehydration in the polyamic acid. Upon this, it is preferable that the amount of the dehydration reagent to be added is from 2 mol to 10 mol and that the amount of the base to be added is from 2 mol to 10 mol, relative to 1 mol of the acid dianhydride as a raw material of the polyamic acid.

The HFIP group-containing polyimide of the present invention can be used in the form of a varnish dissolved in organic solvent, powder, film or solid. Upon this, according to need, it is optional to add an additive, such as oxidation stabilizing agent, filler, silane coupling agent, photosensitizer, photoinitiator or sensitizer, etc., into the obtained HFIP group-containing polyimide. In the case of using in the form of varnish, it can be applied onto glass, silicon wafer, metal, metal oxide, ceramic or resin, etc. by a publicly known method, such as spin coating, spraying, flow coating, impregnation, brushing, etc.

5. HFIP Group-Containing Polyamide and its Polymerization Method

The present invention provides HFIP group-containing polyamide of Invention 15, containing a repeating unit represented by the general formula (12),

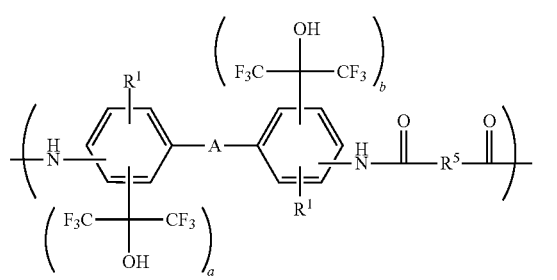

(A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, $R^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each of "a" and "b" independently represents an integer of 0-2, and 1≤a+b≤4.).

Furthermore, the present invention provides a method for producing HFIP group-containing polyamide of Invention 15, containing a repeating unit represented by the above general formula (12), by polycondensing a diamine represented by the general formula (1),

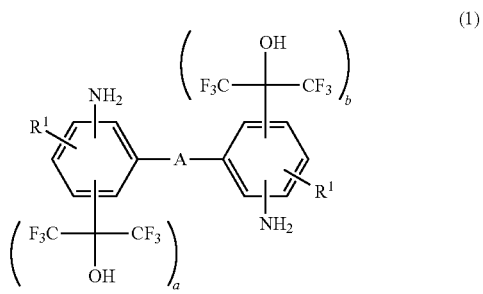

(In the formula, A represents a single bond, an ether bond, a sulfide bond, CO, $CH_2$, SO, $SO_2$, $C(CH_3)_2$, NHCO or $C(CF_3)_2$, or a bivalent group having an aliphatic ring, a hetero ring or an aromatic ring, each $R^1$ independently represents a $C_{1-4}$ alkyl group or a halogen group, and each of "a" and "b" independently represents an integer of 0-2, and 1≤a+b≤4.)

with a dicarboxylic acid or a derivative thereof, represented by the general formula (13),

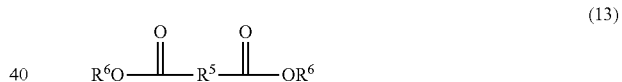

(In the formula, $R^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and each $R^6$ independently represents at least one group selected from a hydrogen atom, a $C_{1-10}$ alkyl group or a benzyl group.)

or a compound represented by the general formula (14),

(In the formula, $R^5$ represents a bivalent organic group containing at least one selected from the group consisting of an aliphatic ring, a heterocyclic ring, an aromatic ring, or a straight-chain or molecular chain aliphatic hydrocarbon group, hydrogen atoms in the organic group may partially be replaced with alkyl group, fluoroalkyl group, carboxyl group, hydroxy group, cyano group or halogen group, and X represents a halogen group.).

Thus, it is possible to obtain a polyamide by a polymerization using as the raw material compounds HFIP group-containing diamine of the present invention and a dicarboxylic acid or its derivative represented by the general formula (13) or a compound represented by the general formula (14). As the derivative, it is possible to use dicarboxylic acid dihalide, dicarboxylic acid monoester, or dicarboxylic acid diester.

When exemplifying dicarboxylic acid represented by the general formula (13), it can be exemplified in aliphatic dicarboxylic acids by oxalic acid, malonic acid, succinic acid, glutaric acid, adipic acid, pimelic acid, suberic acid, azelaic acid, and sebacic acid. It can be exemplified in aromatic dicarboxylic acids by phthalic acid, isophthalic acid, terephthalic acid, 3,3'-dicarboxyldiphenyl ether, 3,4'-dicarboxyldiphenyl ether, 4,4'-dicarboxyldiphenyl ether, 3,3'-dicarboxyldiphenylmethane, 3,4'-dicarboxyldiphenylmethane, 4,4'-dicarboxyldiphenylmethane, 3,3'-dicarboxyldiphenyldifluoromethane, 3,4'-dicarboxyldiphenyldifluoromethane, 4,4'-dicarboxyldiphenyldifluoromethane, 3,3'-dicarboxyldiphenyl sulfone, 3,4'-dicarboxyldiphenyl sulfone, 3,4'-dicarboxyldiphenyl sulfone, 3,3'-dicarboxyldiphenyl sulfide, 3,4'-dicarboxyldiphenyl sulfide, 4,4'-dicarboxyldiphenyl sulfide, 3,3'-dicarboxyldiphenyl ketone, 3,4'-dicarboxyldiphenyl ketone, 4,4'-dicarboxyldiphenyl ketone, 2,2-bis(3-carboxyphenyl)propane, 2,2-bis(3,4'-dicarboxyphenyl)propane, 2,2-bis(4-carboxyphenyl)propane, 2,2-bis(3-carboxyphenyl)hexafluoropropane, 2,2-bis(3,4'-dicarboxyphenyl)hexafluoropropane, 2,2-bis(4-carboxyphenyl)hexafluoropropane, 1,3-bis(3-carboxyphenoxy)benzene, 1,4-bis(3-carboxyphenoxy)benzene, 1,4-bis(4-carboxyphenoxy)benzene, 3,3'-(1,4-phenylenebis(1-methylethylidene))bisbenzoic acid, 3,4'-(1,4-phenylenebis(1-methylethylidene))bisbenzoic acid, 4,4'-(1,4-phenylenebis(1-methylethylidene))bisbenzoic acid, 2,2-bis(4-(3-carboxyphenoxy)phenylpropane, 2,2-bis(4-(4-carboxyphenoxy)phenylpropane, 2,2-bis(4-(3-carboxyphenoxy)phenylhexafluoropropane, 2,2-bis(4-(4-carboxyphenoxy)phenylhexafluoropropane, 2,2-bis(4-(3-carboxyphenoxy)phenylsulfide, 2,2-bis(4-(4-carboxyphenoxy)phenylsulfide, 2,2-bis(4-(3-carboxyphenoxy)phenylsulfone, 2,2-bis(4-(4-carboxyphenoxy)phenylsulfone, 5-(perfluorononenyloxy)phthalic acid, 5-(perfluorononenyloxy)isophthalic acid, perfluorononenyloxy group-containing dicarboxylic acids such as 5-(perfluorononenyloxy)terephthalic acid, 4-methoxy-5-(perfluorononenyloxy)isophthalic acid, 5-(perfluorohexenyloxy)isophthalic acid, perfluorohexenyloxy group-containing dicarboxylic acids such as 4-(perfluorohexenyloxy)phthalic acid, 2-(perfluorohexenyloxy)isophthalic acid, etc. The dicarboxylic acid derivatives are ones, in which the carboxylic group of these carboxylic acids has been protected with a protecting group, and which are represented by the general formula (13) or the general formula (14).

The method and the conditions of the polymerization reaction are not particularly limited. For example, it is possible to cite a method in which the above-mentioned component and an amide-forming derivative of the above-mentioned dicarboxylic acid are melted (fused) with each other at a temperature that is 150° C. or higher and lower than 250° C. to conduct the reaction with no solvent or a method in which the reaction is conducted in an organic solvent of −20° C. to 80° C.

As the organic solvent usable, it is possible to mention one in which both of the diamine as the raw material compound and the carboxylic acid or its derivative represented by the general formula (13) or the compound represented by the general formula (14) are soluble. It can be exemplified by amide-series solvents, such as N,N-dimethylformamide, N,N-dimethylacetamide, N-methylformamide, hexamethylphosphoric triamide or N-methyl-2-pyrrolidone, aromatic solvents, such as benzene, anisole, diphenyl ether, nitrobenzene, benzonitrile, halogen-series solvents, such as chloroform, dichloromethane, 1,2-dichloroethane or 1,1,2,2-tetrachloroethane, or lactone-series solvents, such as γ-butyrolactone, γ-valerolactone, γ-caprolactone, ε-caprolactone or α-methyl-γ-butyrolactone. It is more effective to conduct the reaction under coexistence of an acid acceptor, such as pyridine, triethylamine, etc. together with these solvents. In particular, if the above-mentioned amide series solvents are used, these solvents by themselves become acid acceptors. Therefore, it is possible to obtain a polyamide of a high degree of polymerization.

It is preferable that the HFIP group-containing polyamide of the present invention has a weight average molecular weight (Mw) of from 10000 to 500000, based on polystyrene. If Mw is less than 10000, the HFIP group-containing polyamide to be obtained is low in strength. Therefore, it is difficult to make an independent film. If it is greater than 500000, the HFIP group-containing polyamide is inferior in solubility. Particularly preferably, it is 50000 or greater and 150000 or less.

6. HFIP Group-Containing Polymer and its Production Method

The present invention provides the HFIP group-containing polymer of Invention 18, containing a repeating unit represented by the general formula (15),

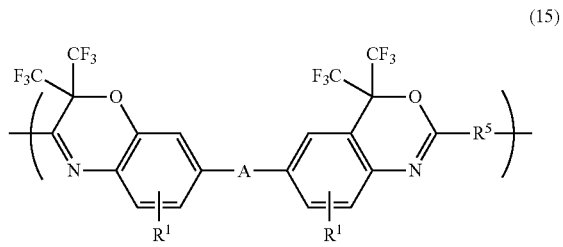

(15)

(In the formula, A represents a single bond, an ether bond, a sulfide bond, CO, CH$_2$, SO, SO$_2$, C(CH$_3$)$_2$, NHCO or C(CF$_3$)$_2$, or a bivalent group having an aliphatic ring, a hetero ring or an aromatic ring, each R$^1$ independently represents a C$_{1-4}$alkyl group or a halogen group, R$^5$ represents a bivalent organic group containing at least one selected from the group consisting of an aliphatic ring, a heterocyclic ring, an aromatic ring, or a straight-chain or molecular chain aliphatic hydrocarbon group, and hydrogen atoms in the organic group may partially be replaced with alkyl group, fluoroalkyl group, carboxyl group, hydroxy group, cyano group or halogen group.).

The polymer compound represented by the general formula (12) of the present invention can be turned by cyclization into the polymer compound represented by the general formula (15). The cyclization reaction can be conducted by heating. It can be conducted by a method to accelerate dehydration, such as the addition of an acid catalyst and then heating.

Specifically, the HFIP group-containing polyamic acid represented by the above-mentioned general formula (12) is dehydrated in the compound by a heating treatment or a reaction with a dehydration reagent to form a ring structure.

With this, it is possible to synthesize a polymer represented by the general formula (15). In the case of conducting a cyclization through dehydration in the polyamic acid by the heating treatment, a ring is formed by a reaction temperature of from 250° C. to 400° C. With this, it is possible to synthesize a polymer represented by the general formula (15). More preferably, it is from 300° C. to 380° C. If the reaction temperature is lower than 250° C., there is a risk that the film strength is impaired or water absorption becomes high when forming the polymer into a coating film, due to an insufficient progress of the cyclization. On the other hand, when the reaction temperature exceeds 400° C., there is a risk that the film strength is impaired or it is stained when forming the polymer into a coating film, due to pyrolysis of a part of the polymer or the like. Furthermore, in the case of conducting the cyclization through dehydration in the polyamic acid by using a dehydration reagent, it is also possible to synthesize the polymer by adding acetic anhydride as a dehydration reagent and furthermore adding a base such as pyridine or triethylamine to conduct a reaction with the polyamic acid and a dehydration in the polyamic acid to achieve the cyclization.

It is preferable that the polymer has a weight average molecular weight (Mw) of from 10000 to 500000, based on polystyrene. If Mw is less than 10000, the polymer is low in strength, and it is difficult to make an independent film. If it is greater than 500000, the polymer is inferior in solubility. Particularly preferably, it is from 50000 to 150000.

7. Fluorescent Material

It is possible to obtain a fluorescent material having a light emission quantum yield of 0.1% or greater by containing the HFIP group-containing polyimide of Inventions 10-12, the HFIP group-containing polyamide of Invention 15, and the HFIP group-containing polymer of Invention 18. A fluorescence having an emission peak at a wavelength of 400 nm to 550 nm is emitted by an irradiation with visible light or ultraviolet light.

EXAMPLES

Next, the present invention is explained in more detail by examples, but the present invention is not limited by the following examples.

Firstly, two kinds of HFIP group-containing diamines were synthesized.

Then, the synthesized HFIP group-containing diamines were reacted with different kinds of tetracarboxylic dianhydrides to obtain HFIP group-containing polyamic acids, followed by obtaining different kinds of HFIP group-containing polyimides (Examples 1-8).

The HFIP group-containing polyimides of the present invention obtained by Examples 1, 3, 6 and 8, conventional polyimides of Comparative Examples 1-5, and a polyimide containing only HFIP groups of Reference Example 1 were subjected to measurements of the fluorescence emission wavelength and the light emission quantum yield to conduct comparisons and evaluations of the fluorescence characteristics.

Synthesis Examples of HFIP Group-Containing Diamines

Firstly, syntheses of two kinds of HFIP group-containing diamines were conducted. In the following, they are shown in detail.

Syntheses of HFIP Group-Containing Diamines, Part 1

Synthesis of (bis(4-amino-3-(1,1,1,3,3,3-hexafluoro-2-hydroxy-2-propyl)-5-methylphenyl)methane Synthesis of bis(4-amino-3-(1,1,1,3,3,3-hexafluoro-2-hydroxy-2-propyl)-5-methylphenyl)methane represented by the following formula, belonging to the HFIP group-containing diamine as the target compound, was conducted.

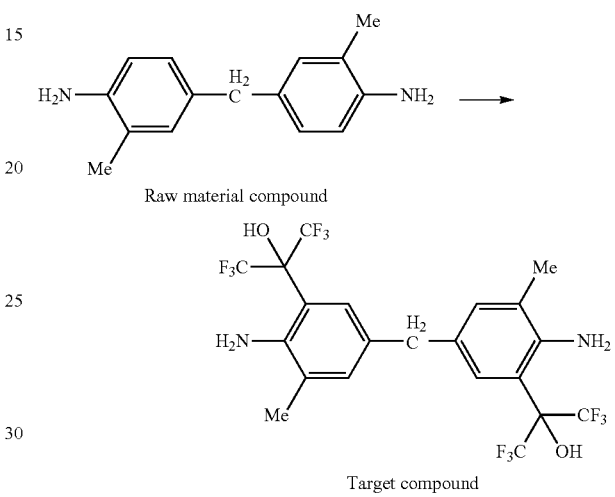

A 300 mL autoclave was charge with 75 g (0.33 mol) of 4,4'-diamino-3,3'-dimethyldiphenylmethane as the raw material compound, 200 g of toluene as a solvent, and 3.1 g of paratoluenesulfonic acid monohydrate as the catalyst, followed by replacing the atmosphere with nitrogen and then sealing. The autoclave was heated at 110° C. in an oil bath, and 115 g of hexafluoroacetone (HFA) was added through a gas inlet of the autoclave, followed by stirring. After stirring for 18 hours, the autoclave was cooled to room temperature (20° C.), followed by filtration. After a washing using chloroform, a drying under reduced pressure was conducted, thereby obtaining 75.1 g (0.14 mol) of a white-color powder of bis(4-amino-3-(1,1,1,3,3,3-hexafluoro-2-hydroxy-2-propyl)-5-methylphenyl)methane as the target compound at a yield of 41%. The data determined by nuclear magnetic resonance spectrum (NMR) are shown in the following.

1H-NMR (dimethylsulfoxide (DMSO)-d6): δ 11.13 (brs, 2H), 6.98 (s, 2H), 6.93 (s, 2H), 5.12 (brs, 4H), 3.66 (s, 2H), 2.10 (s, 6H). $^{19}$F-NMR (DMSO-d6): δ −72.97 (s).

Syntheses of HFIP Group-Containing Diamines, Part 2

Synthesis of 3,3'-bis(1,1,1,3,3,3-hexafluoro-2-hydroxy-2-propyl)-5,5'-dimethylbenzidine Synthesis of 3,3'-bis(1,1,1,3,3,3-hexafluoro-2-hydroxy-2-propyl)-5,5'-dimethylbenzidine represented by the following formula, belonging to the HFIP group-containing diamine as the target compound, was conducted.

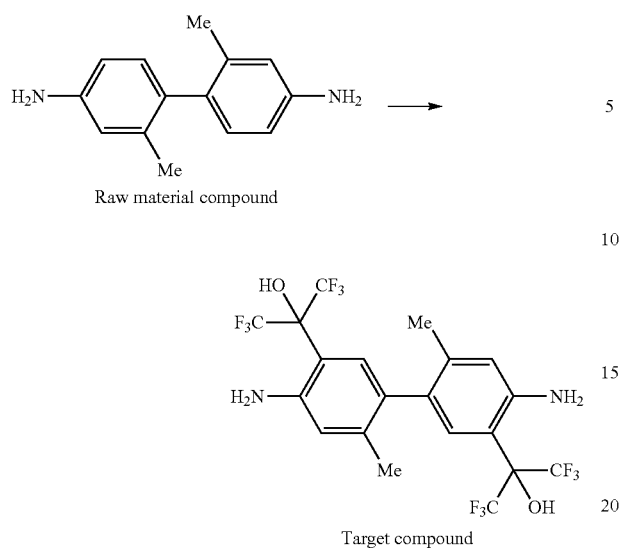

Raw material compound

Target compound

A 300 mL autoclave was charge with 42.4 g (0.200 mol) of m-trizine as the raw material compound, 220 g (1.00 mol) of hexafluoroacetone trihydrate, and 1.9 g (10 mmol) of paratoluenesulfonic acid monohydrate as the catalyst, followed by replacing the atmosphere with nitrogen and then sealing. The autoclave was heated at 135° C. in an oil bath, followed by stirring. After a continuous stirring for 22 hours, the autoclave was cooled to room temperature (20° C.), followed by opening and a filtration of the contents. The powder obtained by the filtration separation and the recovery was washed with diisopropyl ether, followed by a drying under reduced pressure, thereby obtaining
75.0 g (0.138 mol) of a white-color powder of 3,3'-bis(1,1,3,3,3-hexafluoro-2-hydroxy-2-propyl)-5,5'-dimethylbenzidine at a yield of 69%. The NMR measurement data are shown in the following.

1H-NMR (DMSO-d6): δ 9.27 (brs, 2H), 6.80 (s, 2H), 6.65 (s, 2H), 5.54 (brs, 4H), 1.88 (s, 6H). 19F-NMR (DMSO-d6): δ −72.78 (s).

Production Example of HFIP Group-Containing Polyimide

Then, in Examples 1-8, the two kinds of HFIP group-containing diamines synthesized were reacted with different kinds of tetracarboxylic dianhydrides to obtain HFIP group-containing polyamic acids, followed by their imidizations, thereby obtaining films by different kinds of HFIP group-containing polyimides.

Example 1

Synthesis of HFIP Group-Containing Diamide Acid

As shown in the following formula, HFIP group-containing polyamic acid was synthesized by a polymerization reaction between bis(4-amino-3-(1,1,1,3,3,3-hexafluoro-2-hydroxy-2-propyl)-5-methylphenyl)methane synthesized by <Syntheses of HFIP group-containing diamines, Part 1> and pyromellitic anhydride (PMDA).

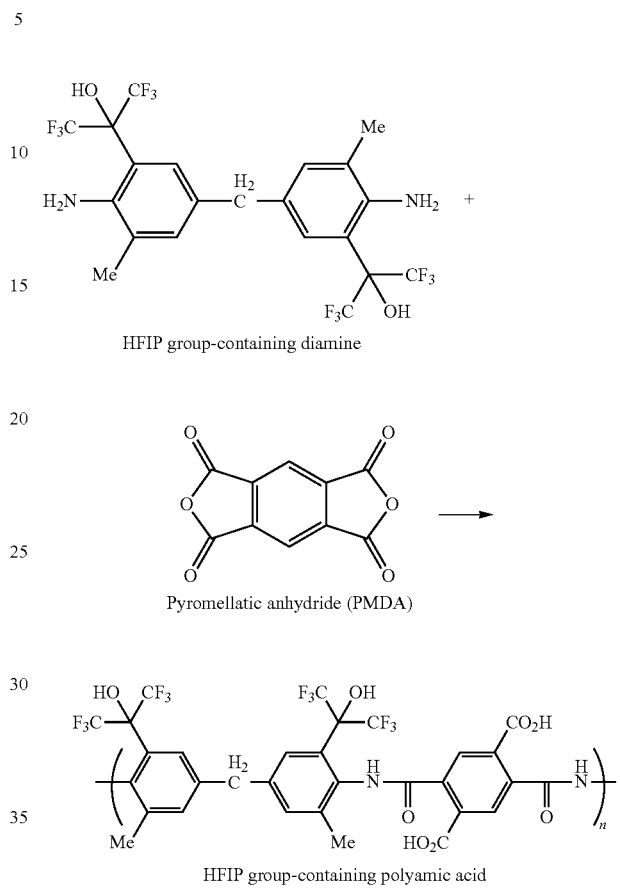

HFIP group-containing diamine

Pyromellatic anhydride (PMDA)

HFIP group-containing polyamic acid n in the formula represents the degree of polymerization, and it is the same in the following.

Specifically, a reaction container having a volume of 300 mL was charged with 20.01 g of bis(4-amino-3-(1,1,1,3,3,3-hexafluoro-2-hydroxy-2-propyl)-5-methylphenyl)methane as a HFIP group-containing diamine, 7.813 g of pyromellitic anhydride, and 64.92 g of N,N-dimethylacetamide as a solvent. Under a nitrogen atmosphere, stirring was conducted at room temperature (20° C.) for 19 hours to conduct the reaction, thereby obtaining a reaction liquid. After the polyimidization of the subsequent reaction, the reaction liquid was confirmed to be a solution of the HFIP group-containing polyamic acid represented by the above formula by conducting an IR measurement. As a result of gel permeation chromatography (GPC) measurement of the solution, the weight average molecular weight (Mw) was 14000.

<Synthesis and Film-Formation of HFIP Group-Containing Polyimide>

Then, a film made of a HFIP group-containing polyimide shown by the following formula was formed on a glass substrate.

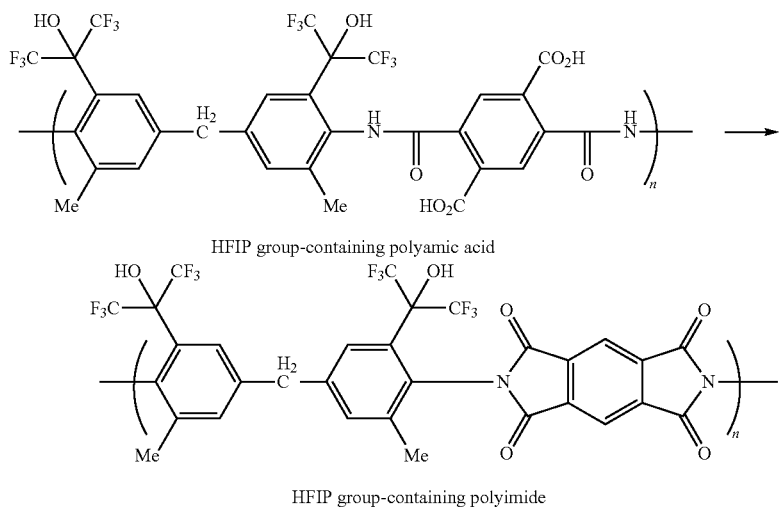

HFIP group-containing polyamic acid

HFIP group-containing polyimide

Specifically, to the solution of the HFIP group-containing polyamic acid, 5.66 g of pyridine and 7.34 g of acetic anhydride were added in this order, followed by stirring at room temperature (20° C.) for four hours to conduct imidization of the HFIP group-containing polyamic acid, thereby obtaining a solution of the HFIP group-containing polyimide. As a result of GPC measurement of the solution, Mw was 13000.

Then, the solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 21 μm. It was confirmed to be a film made of the above-mentioned HFIP group-containing polyimide, due to absorptions characteristic of an imide group at 1777 cm$^{-1}$ and 1722 cm$^{-1}$ in the measurement results of infrared absorption (IR) spectrum.

Example 2

Synthesis of HFIP Group-Containing Amide Acid

As shown in the following formula, a HFIP group-containing polyamic acid was synthesized by a polymerization reaction between bis(4-amino-3-(1,1,1,3,3,3-hexafluoro-2-hydroxy-2-propyl)-5-methylphenyl)methane synthesized by <Syntheses of HFIP group-containing diamines, Part 1> and the following carboxylic anhydride (6FDA).

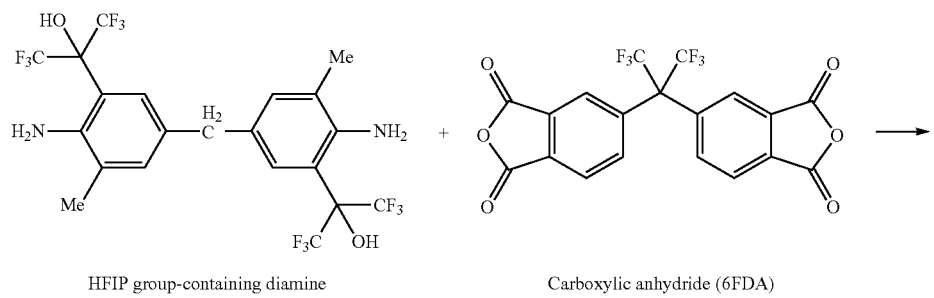

HFIP group-containing diamine     Carboxylic anhydride (6FDA)

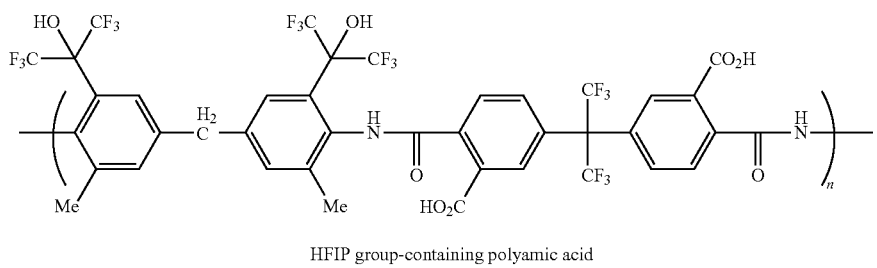

HFIP group-containing polyamic acid

Specifically, a reaction container having a volume of 300 mL was charged with 9.999 g of bis(4-amino-3-(1,1,1,3,3,3-hexafluoro-2-hydroxy-2-propyl)-5-methylphenyl)methane as the HFIP group-containing diamine, 7.956 g of the above-mentioned carboxylic anhydride, and 41.90 g of N,N-dimethylacetamide as the solvent. Under a nitrogen atmosphere, stirring was conducted at room temperature (20° C.) for 22 hours to obtain a reaction liquid. After the polyimidization of the subsequent reaction, the reaction liquid was confirmed to be a solution of the HFIP group-containing polyamic acid represented by the above formula by conducting an IR measurement. As a result of the GPC measurement of the solution, Mw was 13000.

<Synthesis and Film-Formation of HFIP Group-Containing Polyimide>

Then, a film made of a HFIP group-containing polyimide shown by the following formula was formed on a glass substrate.

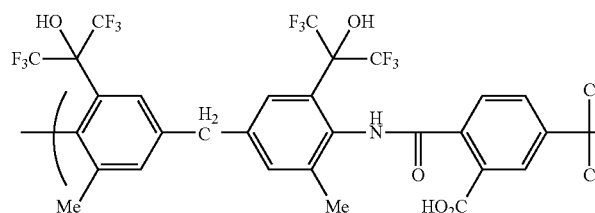
HFIP group-containing polyamic acid

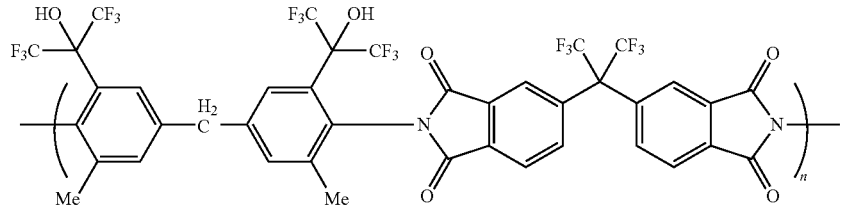
HFIP group-containing polyimide

To the solution of the HFIP group-containing polyamic acid, 2.85 g of pyridine and acetic anhydride (3.656 g) were added in this order, followed by stirring at room temperature (20° C.) for four hours to conduct imidization of the HFIP group-containing polyamic acid, thereby obtaining a solution of the HFIP group-containing polyimide. As a result of GPC measurement of the solution, Mw was 11500.

Then, the solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 18 μm. It was confirmed to be a film made of the above-mentioned HFIP group-containing polyimide, due to absorptions characteristic of an imide group at 1790 cm$^{-1}$ and 1717 cm$^{-1}$ in the measurement results of IR spectrum.

Example 3

Synthesis of HFIP Group-Containing Diamide Acid

As shown in the following formula, a HFIP group-containing polyamic acid was synthesized by a polymerization reaction between 3,3'-bis(1,1,1,3,3,3-hexafluoro-2-hydroxy-2-propyl)-5,5'-dimethylbenzidine synthesized by <Syntheses of HFIP group-containing diamines, Part 2> and pyromellitic anhydride.

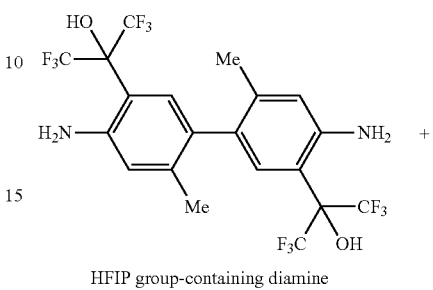
HFIP group-containing diamine

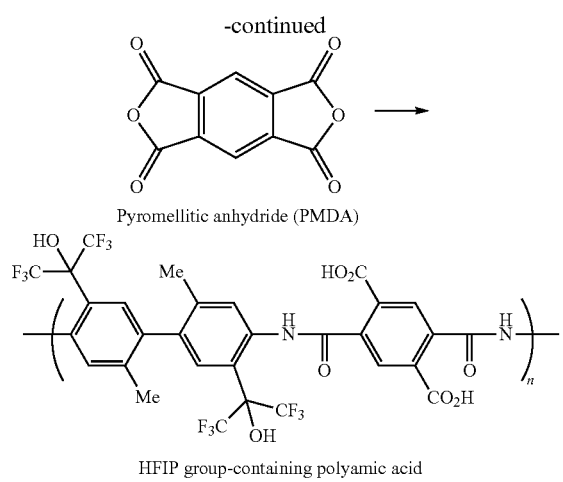
Pyromellitic anhydride (PMDA)

HFIP group-containing polyamic acid

Specifically, a reaction container having a volume of 300 mL was charged with 10.00 g of 3,3'-bis(1,1,1,3,3,3-hexafluoro-2-hydroxy-2-propyl)-5,5'-dimethylbenzidine as the HFIP group-containing diamine, 4.005 g of pyromellitic anhydride, and 32.71 g of N,N-dimethylacetamide as the solvent. Under a nitrogen atmosphere, stirring was conducted at room temperature (20° C.) for 19 hours to obtain a reaction liquid. After the polyimidization of the subsequent reaction, the reaction liquid was confirmed to be a solution of the HFIP group-containing polyamic acid represented by the above formula by conducting an IR measurement. As a result of the GPC measurement of the solution, Mw was 72500.

<Synthesis and Film-Formation of HFIP Group-Containing Polyimide>

Then, a film made of the following HFIP group-containing polyimide was formed on a glass substrate.

The solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 13 μm. It was confirmed to be a film made of the above-mentioned HFIP group-containing polyimide, due to absorptions characteristic of an imide group at 1723 cm$^{-1}$ and 1789 cm$^{-1}$ from the measurement results of IR spectrum.

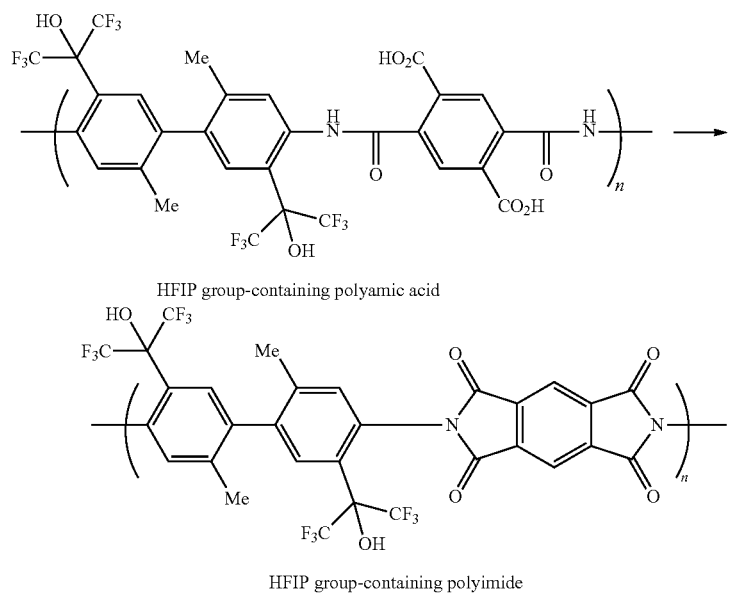

HFIP group-containing polyamic acid

HFIP group-containing polyimide

Specifically, to the solution of the HFIP group-containing polyamic acid, 2.90 g of pyridine and 3.66 g of acetic anhydride were added in this order, followed by stirring at room temperature (20° C.) for four hours to conduct imidization of the HFIP group-containing polyamic acid, thereby obtaining a solution of the HFIP group-containing polyimide. As a result of GPC measurement of the solution, Mw was 70500.

Example 4

Synthesis of HFIP Group-Containing Diamide Acid

As shown in the following formula, a HFIP group-containing polyamic acid was synthesized by a polymerization reaction between 3,3'-bis(1,1,1,3,3,3-hexafluoro-2-hydroxy-2-propyl)-5,5'-dimethylbenzidine synthesized by <Syntheses of HFIP group-containing diamines, Part 2> and tetracarboxylic dianhydride (6FDA).

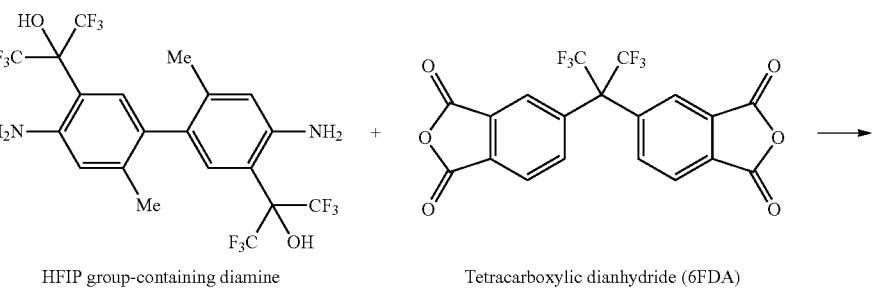

HFIP group-containing diamine    Tetracarboxylic dianhydride (6FDA)

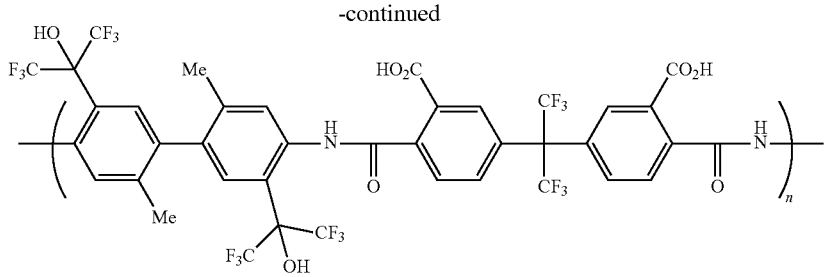

HFIP group-containing polyamic acid

Specifically, a reaction container having a volume of 300 mL was charged with 9.999 g of 3,3'-bis(1,1,1,3,3,3-hexafluoro-2-hydroxy-2-propyl)-5,5'-dimethylbenzidine as the HFIP group-containing diamine, 8.154 g of tetracarboxylic dianhydride, and 65.80 g of N,N-dimethylacetamide as the solvent. Under a nitrogen atmosphere, stirring was conducted at room temperature (20° C.) for 17 hours to obtain a reaction liquid. After the polyimidization of the subsequent reaction, the reaction liquid was confirmed to be a solution of the HFIP group-containing polyamic acid represented by the above formula by conducting an IR measurement. As a result of the GPC measurement of the solution, Mw was 43000.

<Synthesis and Film-Formation of HFIP Group-Containing Polyimide>

Then, a film made of the following HFIP group-containing polyimide was formed on a glass substrate.

thereby obtaining a solution of the HFIP group-containing polyimide. As a result of GPC measurement of the solution, Mw was 42000.

The solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 28 μm. It was confirmed to be a film made of the above-mentioned HFIP group-containing polyimide, due to absorptions characteristic of an imide group at 1791 cm$^{-1}$ and 1726 cm$^{-1}$ from the measurement results of IR spectrum.

Example 5

Synthesis of HFIP Group-Containing Diamide Acid

As shown in the following formula, a HFIP group-containing polyamic acid was synthesized by a polymeriza-

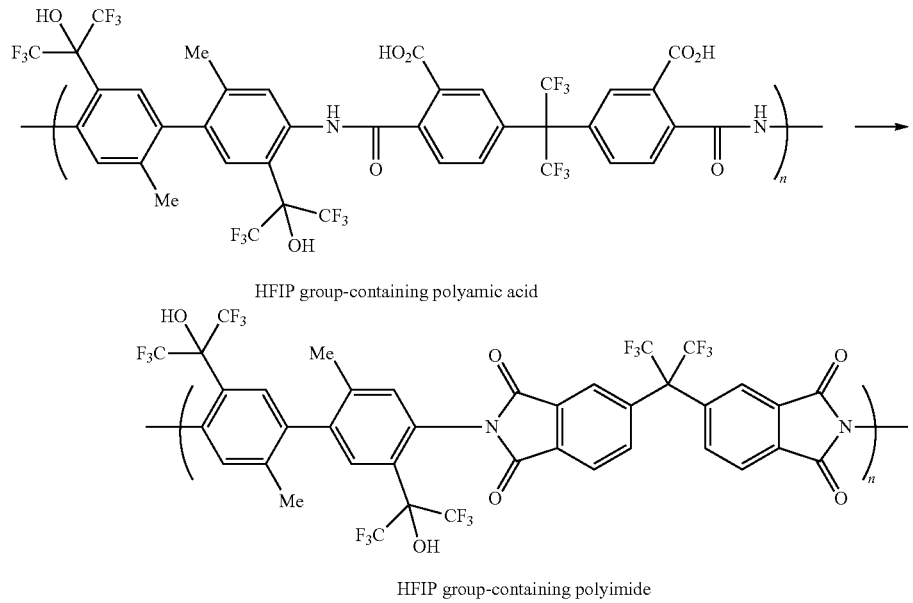

HFIP group-containing polyamic acid

HFIP group-containing polyimide

Specifically, to the solution of the HFIP group-containing polyamic acid, 2.92 g of pyridine and 3.76 g of acetic anhydride were added in this order, followed by stirring at room temperature (20° C.) for four hours to conduct imidization of the HFIP group-containing polyamic acid, tion reaction between 3,3'-bis(1,1,1,3,3,3-hexafluoro-2-hydroxy-2-propyl)-5,5'-dimethylbenzidine synthesized by <Syntheses of HFIP group-containing diamines, Part 2> and tetracarboxylic dianhydride (BTDA).

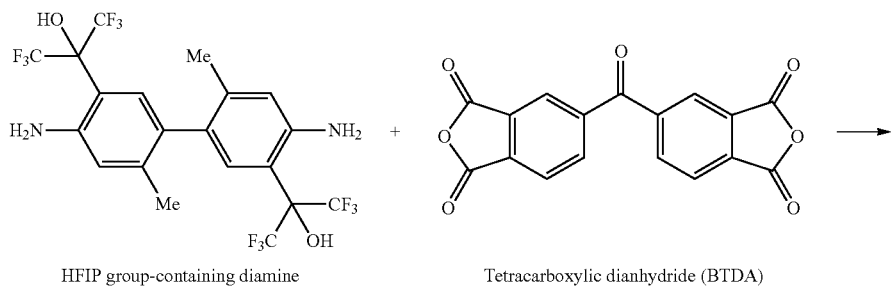

HFIP group-containing diamine     Tetracarboxylic dianhydride (BTDA)

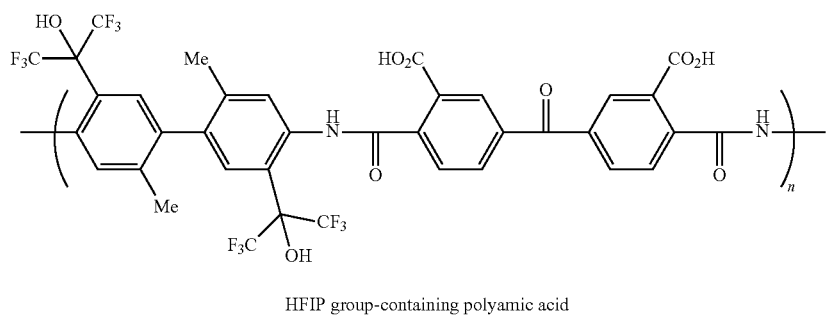

HFIP group-containing polyamic acid

Specifically, a reaction container having a volume of 300 mL was charged with 20.01 g of 3,3'-bis(1,1,1,3,3,3-hexafluoro-2-hydroxy-2-propyl)-5,5'-dimethylbenzidine as the HFIP group-containing diamine, 5.919 g of the above tetracarboxylic dianhydride, and 37.14 g of N,N-dimethylacetamide as the solvent. Under a nitrogen atmosphere, stirring was conducted at room temperature (20° C.) for 22 hours to obtain a reaction liquid. After the polyimidization of the subsequent reaction, the reaction liquid was confirmed to be a solution of the HFIP group-containing polyamic acid represented by the above formula by conducting an IR measurement. As a result of the GPC measurement of the solution, Mw was 48000.

<Synthesis and Film-Formation of HFIP Group-Containing Polyimide>

Then, a film made of the following HFIP group-containing polyimide was formed on a glass substrate.

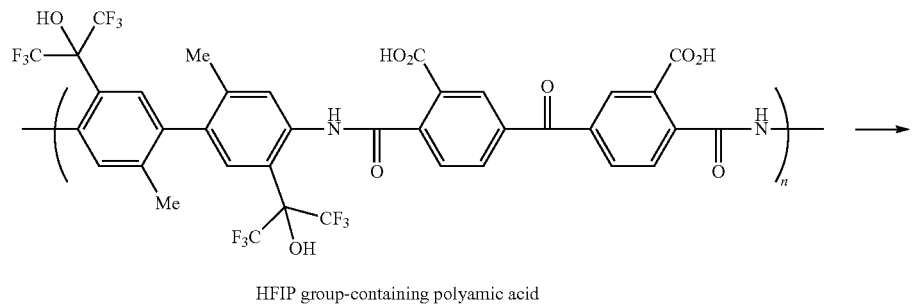

HFIP group-containing polyamic acid

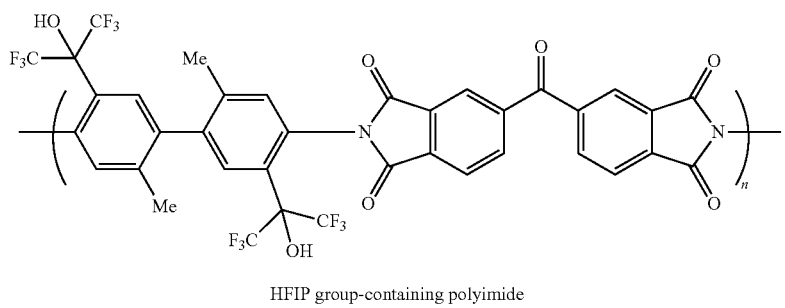

HFIP group-containing polyimide

Specifically, to the solution of the HFIP group-containing polyamic acid, 2.94 g of pyridine and 3.77 g of acetic anhydride were added in this order, followed by stirring at room temperature (20° C.) for four hours to conduct imidization of the HFIP group-containing polyamic acid, thereby obtaining a solution of the HFIP group-containing polyimide. As a result of GPC measurement of the solution, Mw was 50500.

The solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 60 μm. It was confirmed to be a film made of the above-mentioned HFIP group-containing polyimide, due to absorptions characteristic of an imide group at 1723 cm$^{-1}$ and 1791 cm$^{-1}$ from the measurement results of IR spectrum.

Example 6

Synthesis of HFIP Group-Containing Diamide Acid

As shown in the following formula, a HFIP group-containing polyamic acid was synthesized by a polymerization reaction between 3,3'-bis(1,1,1,3,3,3-hexafluoro-2-hydroxy-2-propyl)-5,5'-dimethylbenzidine synthesized by <Syntheses of HFIP group-containing diamines, Part 2> and tetracarboxylic dianhydride (BPDA).

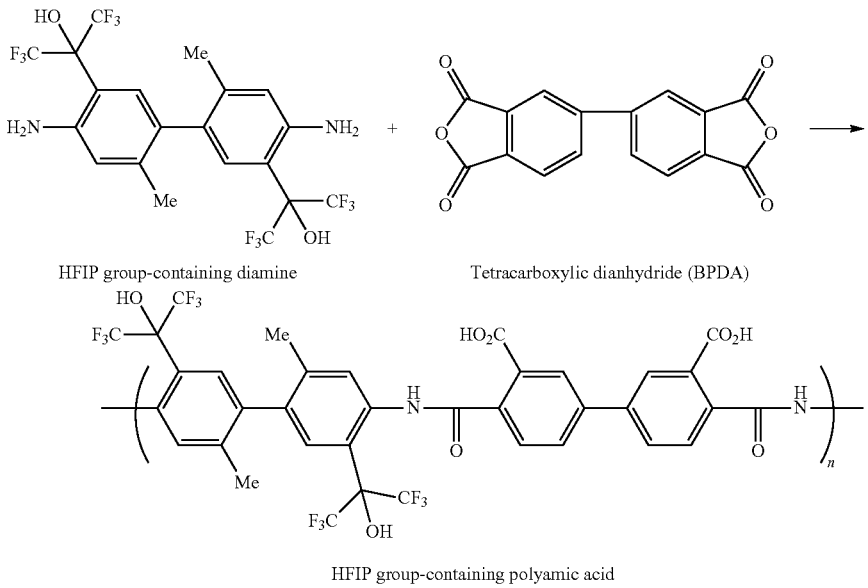

Specifically, a reaction container having a volume of 300 mL was charged with 10.00 g of 3,3'-bis(1,1,1,3,3,3-hexafluoro-2-hydroxy-2-propyl)-5,5'-dimethylbenzidine as the HFIP group-containing diamine, 5.404 g of tetracarboxylic dianhydride, and 36.00 g of N,N-dimethylacetamide as the solvent. Under a nitrogen atmosphere, stirring was conducted at room temperature (20° C.) for 23 hours to obtain a reaction liquid. After the polyimidization of the subsequent reaction, the reaction liquid was confirmed to be a solution of the HFIP group-containing polyamic acid represented by the above formula by conducting an IR measurement. As a result of the GPC measurement of the solution, Mw was 90000.

<Synthesis and Film-Formation of HFIP Group-Containing Polyimide>

Then, a film made of the following HFIP group-containing polyimide was formed on a glass substrate.

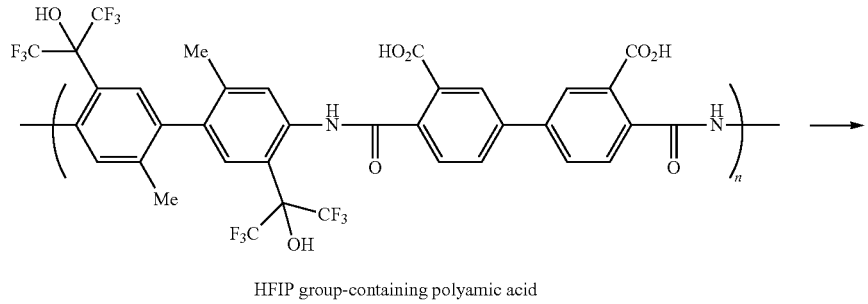

-continued

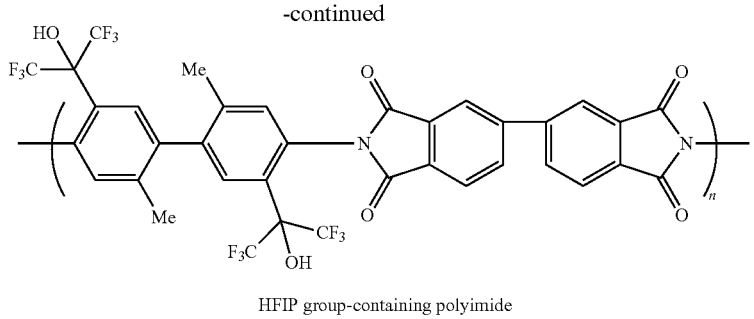

HFIP group-containing polyimide

Specifically, to the solution of the HFIP group-containing polyamic acid, 2.92 g of pyridine and 3.77 g of acetic anhydride were added in this order, followed by stirring at room temperature (20° C.) for four hours to conduct imidization of the HFIP group-containing polyamic acid, thereby obtaining a solution of the HFIP group-containing polyimide. As a result of GPC measurement of the solution, Mw was 98000.

The solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 51 μm. It was confirmed to be a film made of the above-mentioned HFIP group-containing polyimide, due to absorptions characteristic of an imide group at 1717 cm$^{-1}$ and 1781 cm$^{-1}$ from the measurement results of IR spectrum.

Example 7

Synthesis of HFIP Group-Containing Diamide Acid

As shown in the following formula, a HFIP group-containing polyamic acid was synthesized by a polymerization reaction between 3,3'-bis(1,1,1,3,3,3-hexafluoro-2-hydroxy-2-propyl)-5,5'-dimethylbenzidine synthesized by <Syntheses of HFIP group-containing diamines, Part 2> and tetracarboxylic dianhydride (DSDA).

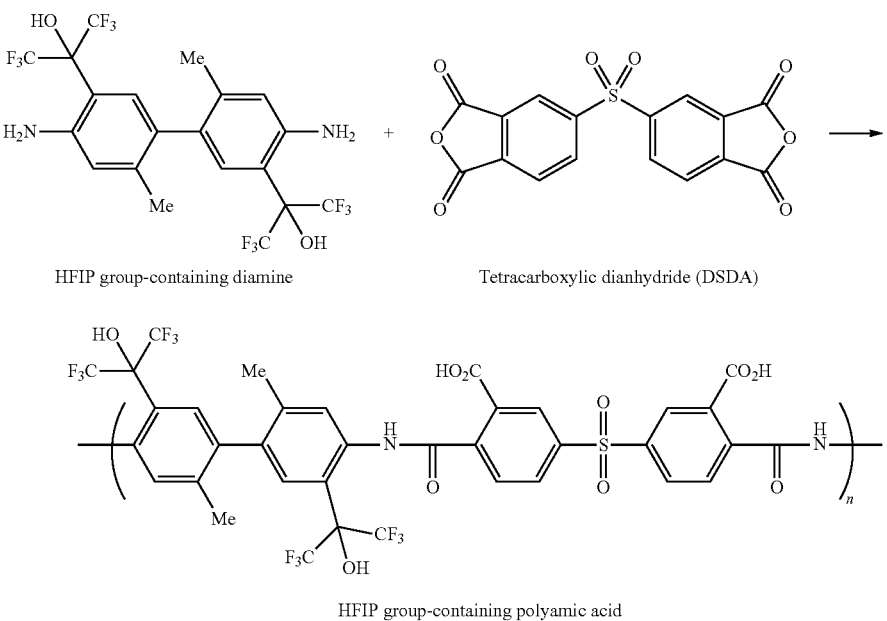

HFIP group-containing diamine    Tetracarboxylic dianhydride (DSDA)

HFIP group-containing polyamic acid

Specifically, a reaction container having a volume of 300 mL was charged with 10.02 g of 3,3'-bis(1,1,1,3,3,3-hexafluoro-2-hydroxy-2-propyl)-5,5'-dimethylbenzidine as the HFIP group-containing diamine, 6.583 g of tetracarboxylic dianhydride, and 39.0 of N,N-dimethylacetamide. Under a nitrogen atmosphere, stirring was conducted at room temperature (20° C.) for 27 hours to obtain a reaction liquid. After the polyimidization of the subsequent reaction, the reaction liquid was confirmed to be a solution of the HFIP group-containing polyamic acid represented by the above formula by conducting an IR measurement. As a result of the GPC measurement of the solution, Mw was 27000.

<Synthesis and Film-Formation of HFIP Group-Containing Polyimide>

Then, a film made of the following HFIP group-containing polyimide was formed on a glass substrate.

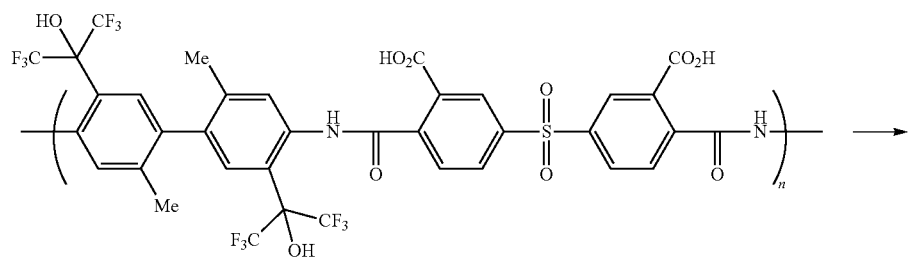

HFIP group-containing polyamic acid

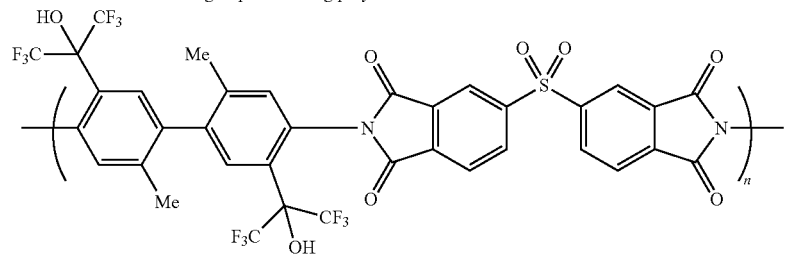

HFIP group-containing polyimide

Specifically, to the solution of the HFIP group-containing polyamic acid, 2.94 g of pyridine and 3.76 g of acetic anhydride were added in this order, followed by stirring at room temperature (20° C.) for four hours to obtain a solution of the HFIP group-containing polyimide. As a result of GPC measurement of the solution, Mw was 26500.

The solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 33 μm. It was confirmed to be a film made of the above-mentioned HFIP group-containing polyimide, due to absorptions characteristic of an imide group at 1731 cm$^{-1}$ and 1791 cm$^{-1}$ from the measurement results of IR spectrum.

Example 8

Synthesis of HFIP Group-Containing Diamide Acid

As shown in the following formula, a HFIP group-containing polyamic acid was synthesized by a polymerization reaction between 3,3'-bis(1,1,1,3,3,3-hexafluoro-2-hydroxy-2-propyl)-5,5'-dimethylbenzidine synthesized by <Syntheses of HFIP group-containing diamines, Part 2> and tetracarboxylic dianhydride (ODPA).

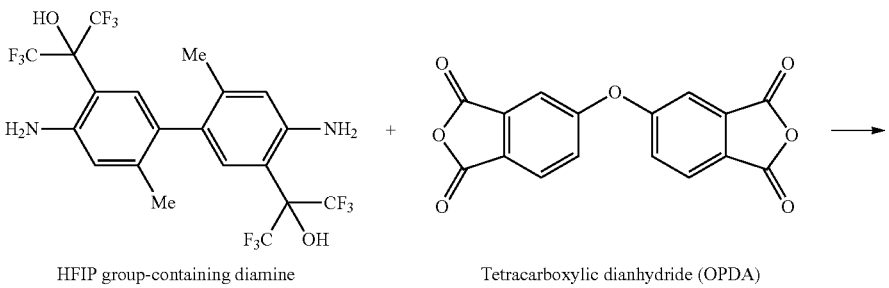

HFIP group-containing diamine     Tetracarboxylic dianhydride (OPDA)

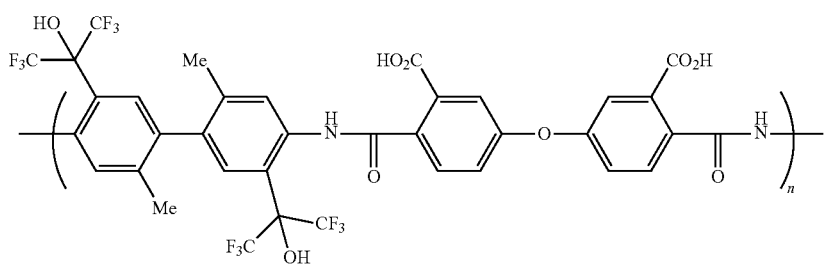

HFIP group-containing polyamic acid

Specifically, a reaction container having a volume of 300 mL was charged with 10.00 g of 3,3'-bis(1,1,1,3,3,3-hexafluoro-2-hydroxy-2-propyl)-5,5'-dimethylbenzidine as the HFIP group-containing diamine, 5.701 g of tetracarboxylic dianhydride (ODPA), and 36.9 g of N,N-dimethylacetamide as the solvent. Under a nitrogen atmosphere, stirring was conducted at room temperature (20° C.) for 20 hours to obtain a reaction liquid. After the polyimidization of the subsequent reaction, the reaction liquid was indirectly confirmed to be a solution of the HFIP group-containing polyamic acid represented by the above formula by conducting an IR measurement. As a result of the GPC measurement of the solution, Mw was 40000.

<Synthesis and Film-Formation of HFIP Group-Containing Polyimide>

Then, a film made of the following HFIP group-containing polyimide was formed on a glass substrate.

Comparative Examples 1-5 and Reference Example 1

Polyimides of Comparative Examples 1-5 and Reference Example 1 shown in Table 1, not belonging to the category of the present invention, were synthesized.

That is, diamine and tetracarboxylic dianhydride were polymerized to synthesize polyamic acid. Then, a cyclization was conducted by a dehydration in the polyamic acid, thereby obtaining a polyamide of Table 1.

Specifically, in a reaction container having a volume of 300 mL, each diamine and tetracarboxylic dianhydride shown in Table 1 were mixed together by a molar ratio of 1:1, followed by adding N,N-dimethylacetamide as the solvent and then stirring under a nitrogen atmosphere at

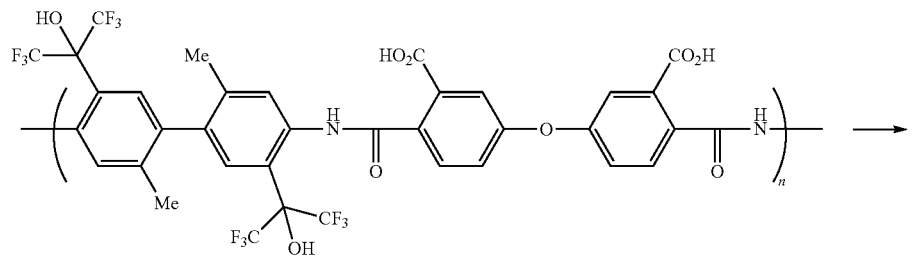

HFIP group-containing polyamic acid

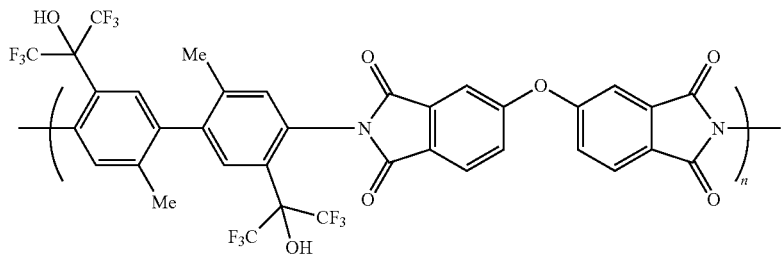

HFIP group-containing polyimide

Specifically, to the solution of the HFIP group-containing polyamic acid, 2.92 g of pyridine and 3.76 g of acetic anhydride were added in this order, followed by stirring at room temperature (20° C.) for four hours to obtain a solution of the HFIP group-containing polyimide. As a result of GPC measurement of the solution, Mw was 47000.

The solution was applied on a glass substrate by using a spin coater, followed by a continuous heating while conducting a stepwise temperature rising at 130° C. for 30 minutes, 180° C. for 30 minutes and 200° C. for 3 hours, thereby obtaining a film on the glass substrate. The film thickness was 55 μm. It was confirmed to be a film made of the above-mentioned HFIP group-containing polyimide, due to absorptions characteristic of an imide group at 1719 cm$^{-1}$ and 1786 cm$^{-1}$ from the measurement results of IR spectrum.

room temperature (20° C.) for 20 hours to obtain a solution containing polyimide acid. Then, to this solution, pyridine and acetic anhydride were added in this order, followed by stirring for four hours at room temperature (20° C.) to achieve a cyclization through a dehydration in the polyamic acid, thereby obtaining each solution containing polyimide shown in Table.

Then, each solution obtained was applied on a glass substrate by using a spin coater, followed by a continuous heating while conducting a stepwise temperature rising at 130° C. for 30 minutes, 180° C. for 30 minutes and 200° C. for 3 hours, thereby obtaining a film made of each polyimide. It was confirmed to be a film made of each polyimide shown in Table 1, due to absorptions characteristic of an imide group at 1720 cm$^{-1}$ and 1780 cm$^{-1}$ from the measurement results of IR spectrum.

TABLE 1
| | diamine | acid anhydride |
|---|---|---|
| Com. Ex. 1 | 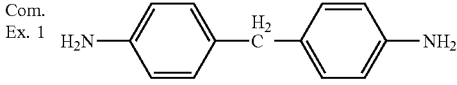 | 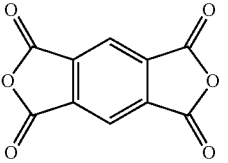 [SMILES: O=c1oc(=O)c2cc3c(=O)oc(=O)c3cc12] |
| Com. Ex. 2 | 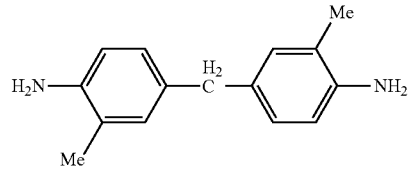 [SMILES: Cc1cc(Cc2ccc(N)c(C)c2)ccc1N] | 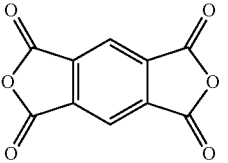 [SMILES: O=c1oc(=O)c2cc3c(=O)oc(=O)c3cc12] |
| Com. Ex. 3 | 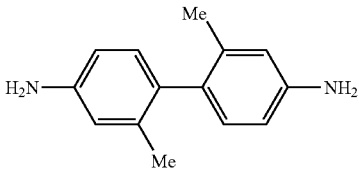 | 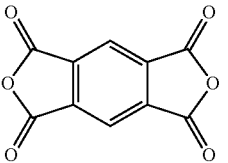 [SMILES: O=c1oc(=O)c2cc3c(=O)oc(=O)c3cc12] |
| Com. Ex. 4 | 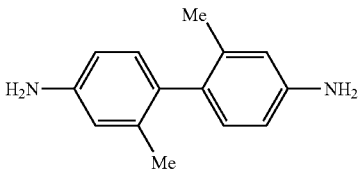 [SMILES: Cc1cc(N)ccc1-c1ccc(N)cc1C] | 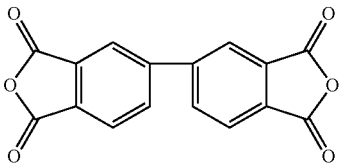 [SMILES: O=C1OC(=O)c2cc(-c3ccc4c(c3)C(=O)OC4=O)ccc21] |
| Com. Ex. 5 | 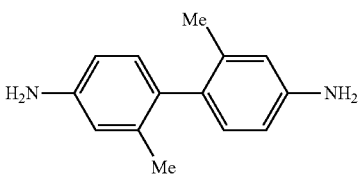 | 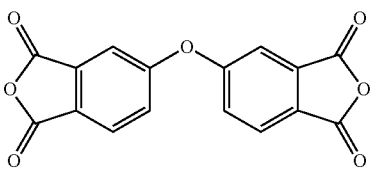 [SMILES: O=C1OC(=O)c2cc(Oc3ccc4c(c3)C(=O)OC4=O)ccc21] |
| Ref. Ex. 1 | 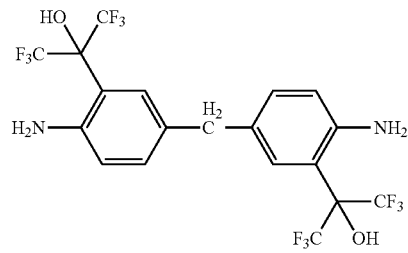 [SMILES: Nc1ccc(Cc2ccc(N)c(C(O)(C(F)(F)F)C(F)(F)F)c2)cc1C(O)(C(F)(F)F)C(F)(F)F] | 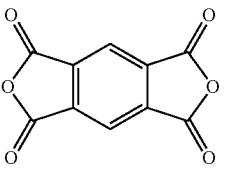 [SMILES: O=c1oc(=O)c2cc3c(=O)oc(=O)c3cc12] |
| | polyimide |
|---|---|
| Com. Ex. 1 | 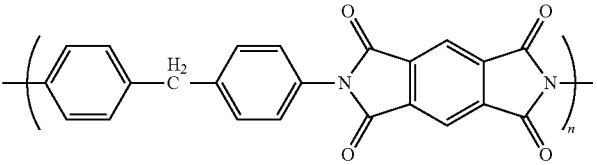 |
| Com. Ex. 2 | 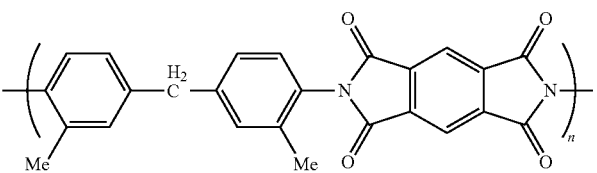 |

TABLE 1-continued

| | |
|---|---|
| Com. Ex. 3 | 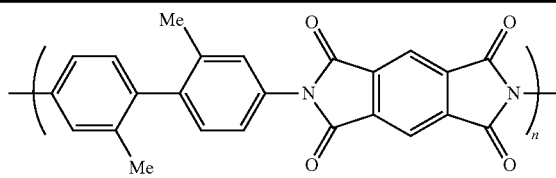 |
| Com. Ex. 4 | 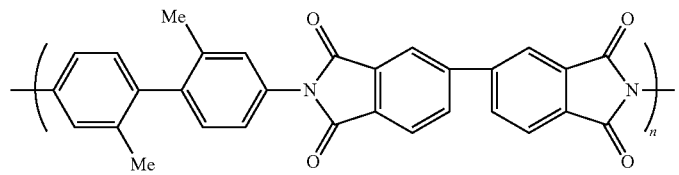 |
| Com. Ex. 5 | 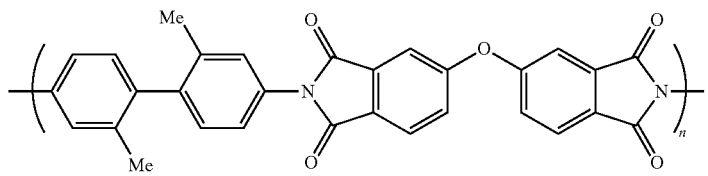 |
| Ref. Ex. 1 | 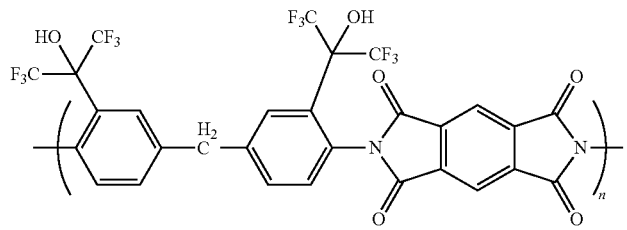 |

[Measurement and Evaluation of Fluorescence Emission Wavelength and Light Emission Quantum Yield]

With respect to the HFIP group-containing polyimides of the present invention obtained by Examples 1, 3, 6 and 8, and conventional polyimides of Comparative Examples 1-3 and the polyimide containing only HFIP groups of Reference Example 1, not belonging to the category of the present invention, the fluorescence emission wavelength and light emission quantum yield were measured to evaluate fluorescence characteristics.

Respective polyimides are shown in Table 2 and Table 3. The polyimides in Example 1, Comparative Example 1, Comparative Example 2 and Comparative Example 3 have the same main polyimide skeleton.

TABLE 2

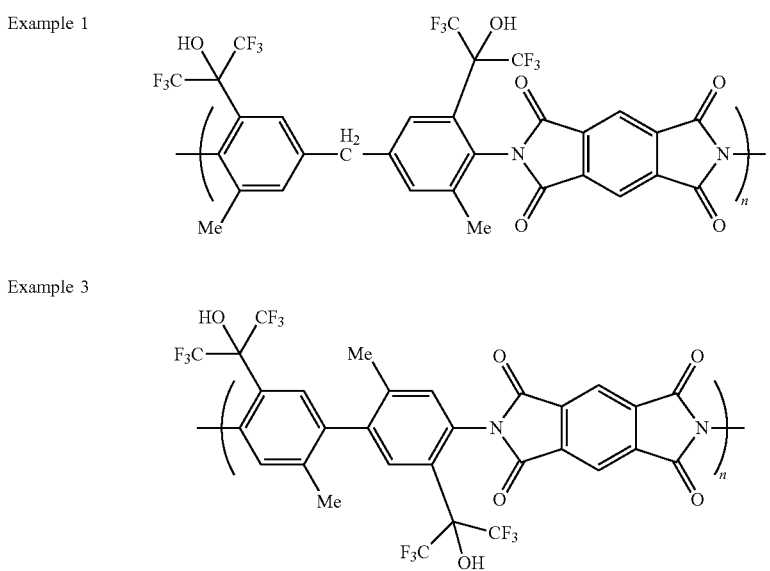

Example 1

Example 3

TABLE 2-continued
| Example 6 | 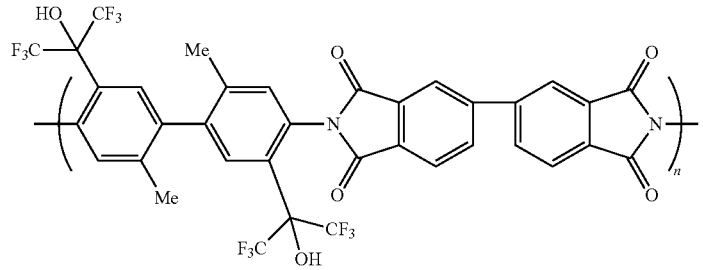 |
| --- | --- |
| Example 8 | 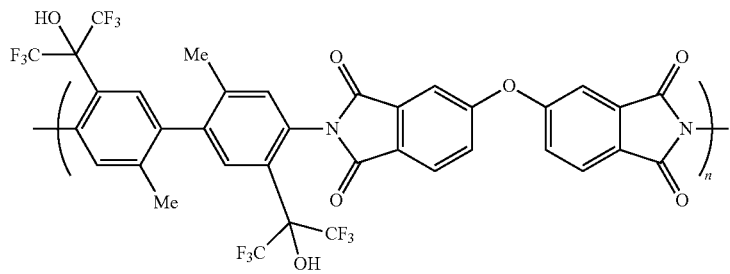 |
TABLE 3
| Comparative Example 1 | 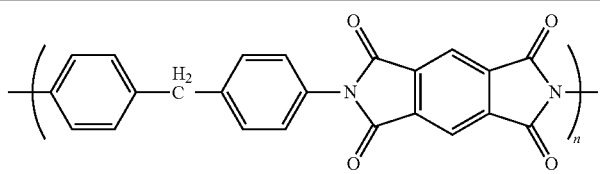 |
| --- | --- |
| Comparative Example 2 | 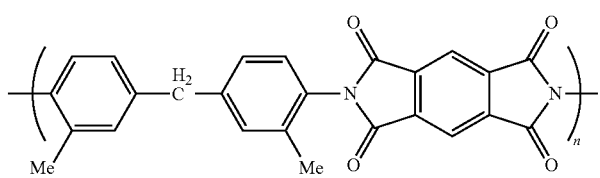 |
| Comparative Example 3 | 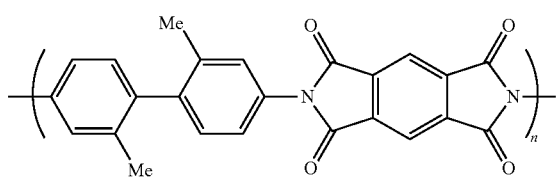 |
| Comparative Example 4 | 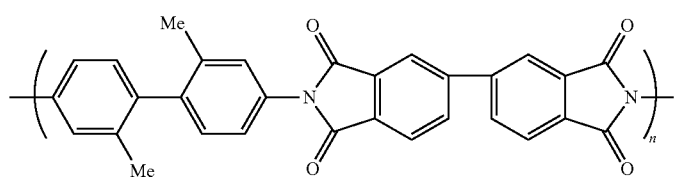 |
| Comparative Example 5 | 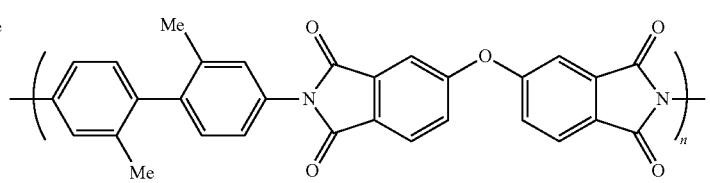 |

TABLE 3-continued

| Reference Example 1 | 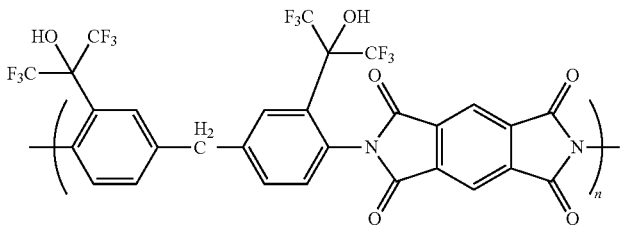 |

In Table 4, there are shown the measurement results of fluorescent emission wavelength and light emission quantum yield measured with an excitation light of an ultraviolet light having a wavelength of 365 nm by a fluorescence spectrometer (made by HORIBA, Ltd.; product name: FluoroMax-4). The fluorescence spectrum was measured by using a polyimide in the form of a film formed on a quartz substrate.

The light emission quantum yield was measured by using a single polyimide film and attaching an integrating sphere to the fluorescence spectrometer.

TABLE 4

| Number | Emission wavelength (nm) | Emission quantum yield (%) |
|---|---|---|
| Example 1 | 468 | 6.8 |
| Example 3 | 459 | 0.36 |
| Example 6 | 448 | 0.16 |
| Example 8 | 464 | 0.24 |
| Com. Ex. 1 | No detection | No detection |
| Com. Ex. 2 | No detection | No detection |
| Com. Ex. 3 | No detection | No detection |
| Com. Ex. 4 | No detection | No detection |
| Com. Ex. 5 | No detection | No detection |
| Ref. Ex. 1 | 494 | 3.2 |

As shown in Table 4, the HFIP group aromatic polyimides containing methyl groups of Examples 1, 3, 6 and 8 of the present invention had fluorescent characteristics to generate fluorescence and had light emission quantum yields not lower than 0.1%.

The polyimides in Example 1, Comparative Example 1, Comparative Example 2 and Reference Example 1 have the same main polyimide skeleton. In the polyimides free of HFIP group of Comparative Example 1 and Comparative Example 2, it was not possible to detect the light emission irrespective of the presence or absence of methyl group. In the polyimides having HFIP groups of Example 1 and Reference Example 1, the light emission was observed. The polyimide of the present invention containing both of HFIP groups and methyl groups of Example 1 showed an extremely high light emission quantum yield, which was in excess of two times that of the polyimide containing only HFIP groups of Reference Example 1. Furthermore, in the polyimides of Comparative Examples 3-5, it was not possible to detect the light emission. However, the polyimides of the present invention having the same main skeletons and both of HFIP groups and methyl groups of Examples 3, 6 and 8 showed high light emission quantum yields of not lower than 0.1% in the visible light region.

The invention claimed is:

1. A diamine represented by the general formula (2),

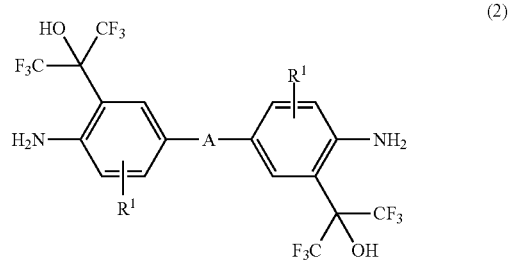

(2)

wherein A represents a single bond, and
each $R^1$ independently represents a $C_{1-4}$ alkyl group or a halogen group.

2. The diamine as claimed in claim 1, represented by the general formula (3),

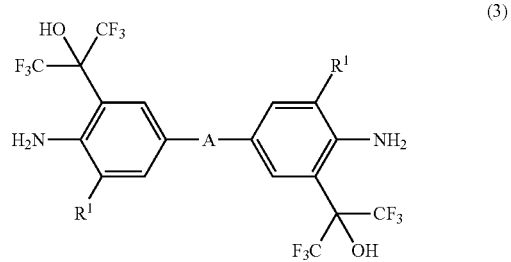

(3)

wherein A represents a single bond, and
each $R^1$ independently represents a $C_{1-4}$ alkyl group or a halogen group.

3. The diamine as claimed in claim 1, represented by the general formula (4),

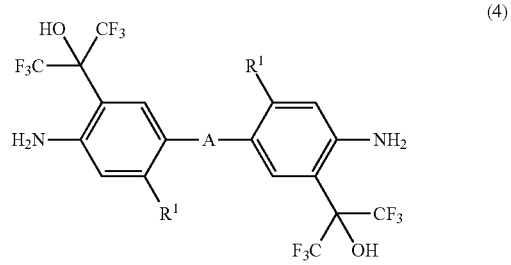

(4)

wherein A represents a single bond, and
each $R^1$ independently represents a $C_{1-4}$ alkyl group or a halogen group.

4. The diamine as claimed in claim 2, wherein $R^1$ is a methyl group.

5. A method for producing a diamine represented by the general formula (1),

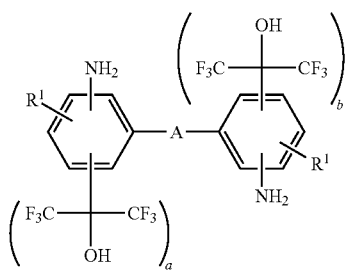
(1)

the method comprising reacting a diamine represented by the general formula (5),

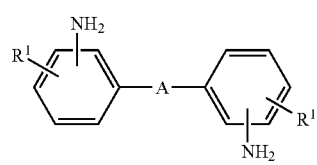
(5)

with hexafluoroacetone or its hydrate;
wherein A represents a single bond,
each $R^1$ independently represents a $C_{1-4}$ alkyl group or a halogen group, and
each of "a" and "b" independently represents an integer of 0-2, and $1 \leq a+b \leq 4$.

6. A polyamic acid comprising a repeating unit represented by the general formula (6),

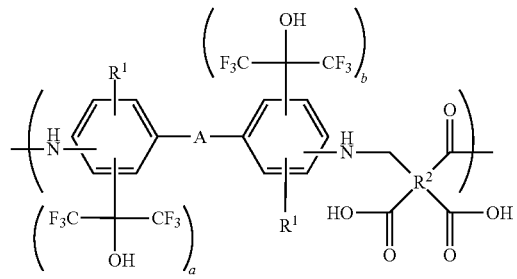
(6)

wherein A represents a single bond or $CH_2$,
each $R^1$ independently represents a $C_{1-4}$ alkyl group or a halogen group,
$R^2$ represents a tetravalent organic group containing at least one group selected from the group consisting of an aliphatic ring, a heterocyclic ring, an aromatic ring, or a straight-chain or branched-chain aliphatic hydrocarbon group,
hydrogen atoms in the tetravalent organic group of $R^2$ may partially be replaced with alkyl group, fluoroalkyl group, carboxyl group, hydroxy group, cyano group or halogen group, and
each of "a" and "b" independently represents an integer of 0-2, and $1 \leq a+b \leq 4$.

7. The polyamic acid as claimed in claim 6, comprising a repeating unit represented by the general formula (7),

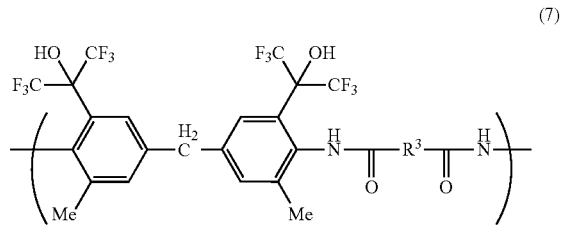
(7)

wherein Me represents a methyl group, and $R^3$ represents a bivalent group which is:

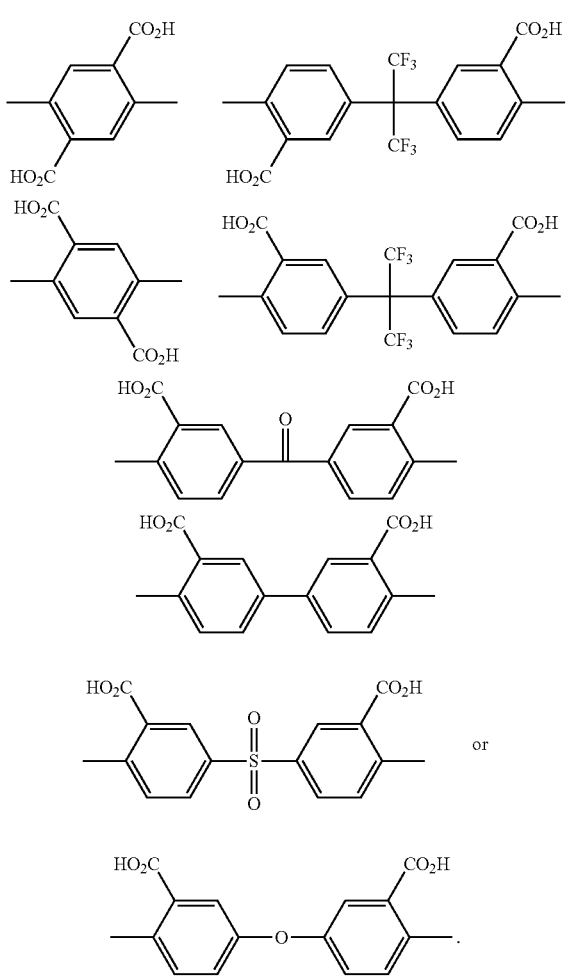

or

8. The polyamic acid as claimed in claim 6, comprising a repeating unit represented by the general formula (8), (8)

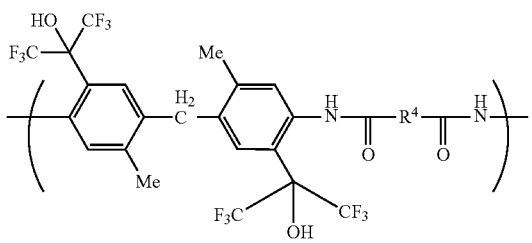

wherein Me represents a methyl group, and R⁴ represents:

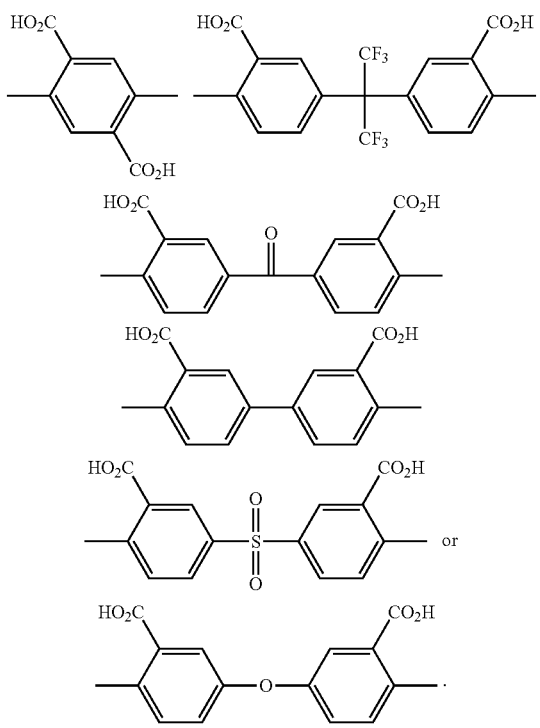

9. A polyimide comprising a repeating unit represented by the general formula (9), (9)

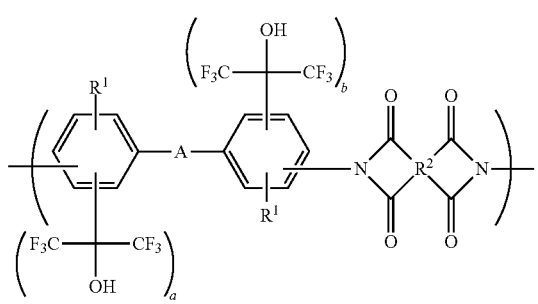

wherein A represents a single bond or $CH_2$,
each $R^1$ independently represents a $C_{1-4}$ alkyl group or a halogen group, $R^2$ represents a tetravalent organic group containing at least one selected from the group consisting of an aliphatic ring, a heterocyclic ring, an aromatic ring, or a straight-chain or branched-chain aliphatic hydrocarbon group, hydrogen atoms in the tetravalent organic group of $R^2$ may partially be replaced with alkyl group, fluoroalkyl group, carboxyl group, hydroxy group, cyano group or halogen group, and each of "a" and "b" independently represents an integer of 0-2, and $1 \leq a+b \leq 4$.

10. The polyimide as claimed in claim 9, comprising a repeating unit represented by the general formula (10), (10)

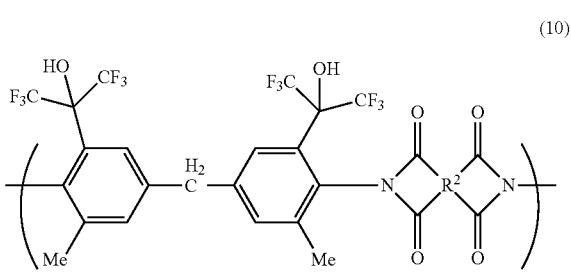

wherein Me represents a methyl group, and $R^2$ represents:

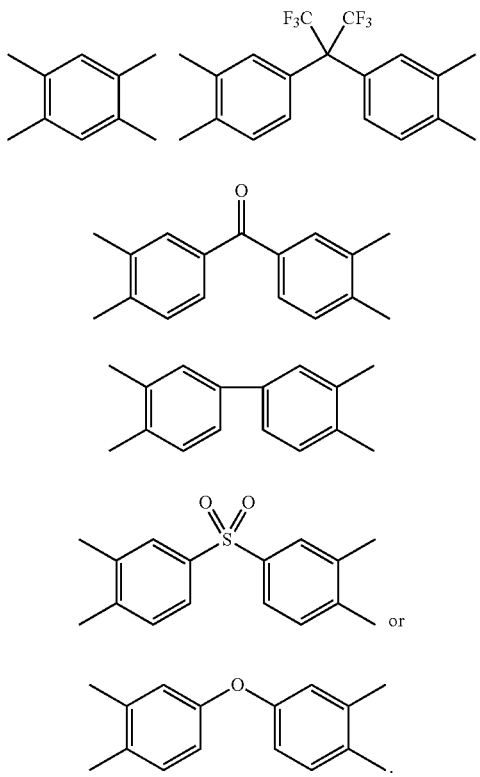

11. The polyimide as claimed in claim 9, comprising a repeating unit represented by the general formula (11),

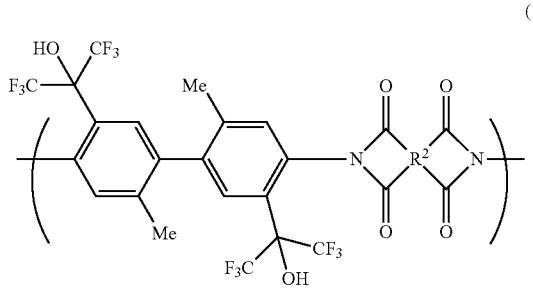
(11)

wherein Me represents a methyl group, and R² represents:

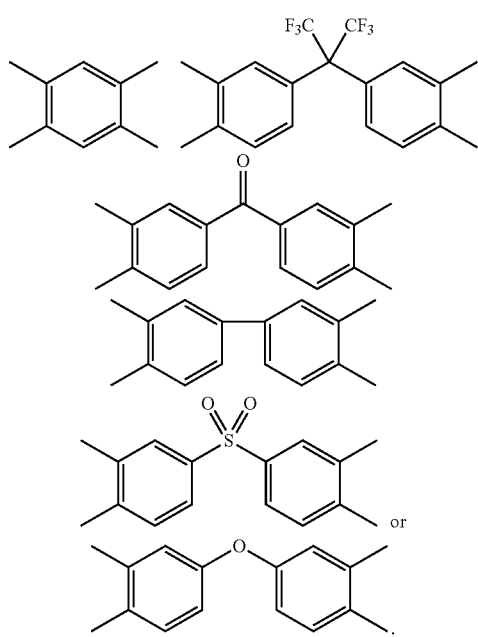

12. A fluorescent material comprising the polyimide as claimed in claim 9 and having a light emission quantum yield of 0.1% or greater.

13. A method for producing a polyimide, comprising:
polymerizing a diamine represented by the general formula (1),

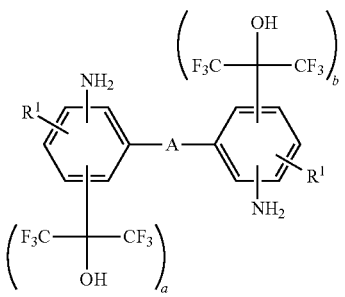
(1)

with a tetracarboxylic dianhydride represented by the general formula (11),

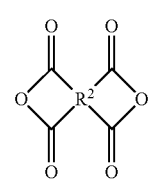
(11)

to produce a polyamic acid containing a repeating unit represented by the general formula (6),

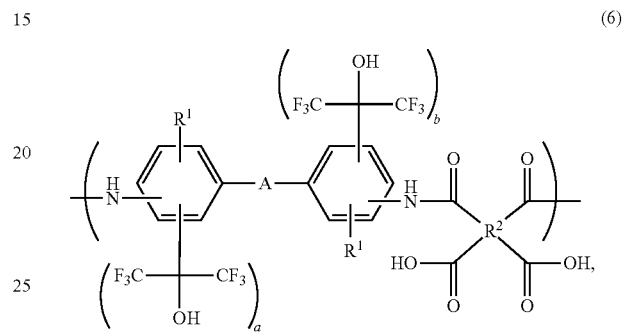
(6)

and
dehydrating the polyamic acid to obtain a polyimide containing a repeating unit represented by the general formula (9),

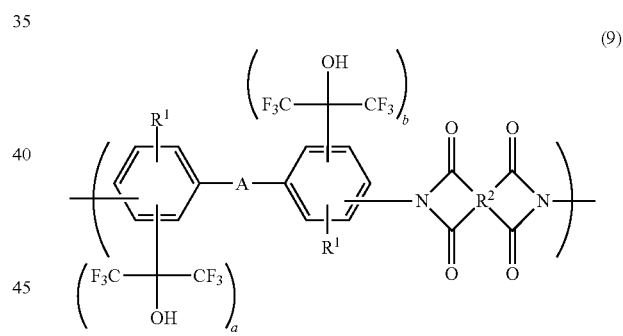
(9)

wherein each A independently represents a single bond or $CH_2$, each $R^1$ independently represents a $C_{1-4}$ alkyl group or a halogen group, $R^2$ represents a tetravalent organic group containing at least one selected from the group consisting of an aliphatic ring, a heterocyclic ring, an aromatic ring, or a straight-chain or branched-chain aliphatic hydrocarbon group, hydrogen atoms in the tetravalent organic group of $R^2$ may partially be replaced with alkyl group, fluoroalkyl group, carboxyl group, hydroxy group, cyano group or halogen group, and each of "a" and "b" independently represents an integer of 0-2, and $1 \leq a+b \leq 4$.

14. A polyamide comprising a repeating unit represented by the general formula (12), (12)

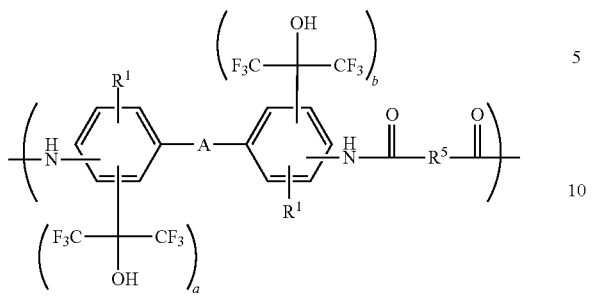

wherein A represents a single bond or $CH_2$,
each $R^1$ independently represents a $C_{1-4}$ alkyl group or a halogen group,
$R^5$ represents a bivalent organic group containing at least one selected from the group consisting of an aliphatic ring, a heterocyclic ring, an aromatic ring, or a straight-chain or branched-chain aliphatic hydrocarbon group,
hydrogen atoms in the bivalent organic group of $R^5$ may partially be replaced with alkyl group, fluoroalkyl group, carboxyl group, hydroxy group, cyano group or halogen group, and
each of "a" and "b" independently represents an integer of 0-2, and $1 \leq a+b \leq 4$.

15. A fluorescent material comprising the polyamide as claimed in claim 14 and having a light emission quantum yield of 0.1% or greater.

16. A method for producing a polyamide containing a repeating unit represented by the general formula (12), (12)

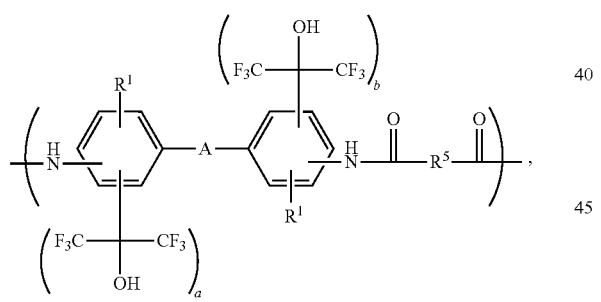

by polycondensing a diamine represented by the general formula (1), (1)

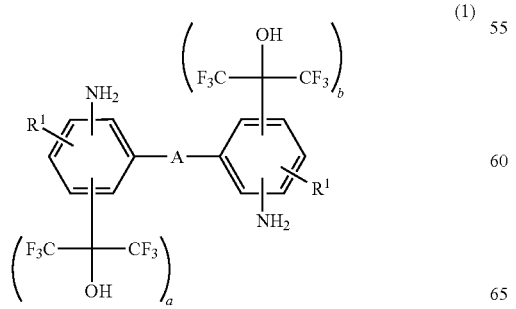

with a dicarboxylic acid or a derivative thereof, represented by the general formula (13), (13)

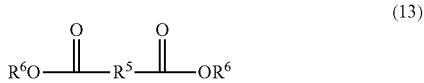

or a dicarboxylic acid derivative represented by the general formula (14), (14)

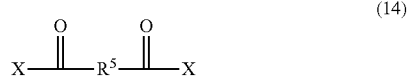

wherein A represents a single bond or $CH_2$,
each $R^1$ independently represents a $C_{1-4}$ alkyl group or a halogen group,
each of "a" and "b" independently represents an integer of 0-2, and $1 \leq a+b \leq 4$,
$R^5$ represents a bivalent organic group containing at least one selected from the group consisting of an aliphatic ring, a heterocyclic ring, an aromatic ring, or a straight-chain or branched-chain aliphatic hydrocarbon group,
hydrogen atoms in the bivalent organic group of $R^5$ may partially be replaced with alkyl group, fluoroalkyl group, carboxyl group, hydroxy group, cyano group or halogen group,
each $R^6$ independently represents at least one group selected from a hydrogen atom, a $C_{1-10}$ alkyl group or a benzyl group, and
X represents a halogen group.

17. A polymer comprising a repeating unit represented by the general formula (15), (15)

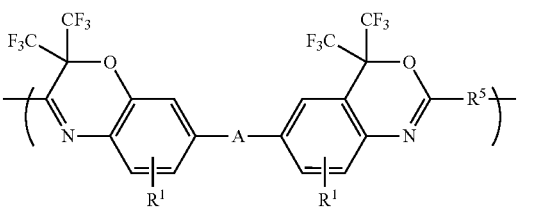

wherein A represents a single bond or $CH_2$,
each $R^1$ independently represents a $C_{1-4}$ alkyl group or a halogen group,
$R^5$ represents a bivalent organic group containing at least one selected from the group consisting of an aliphatic ring, a heterocyclic ring, an aromatic ring, or a straight-chain or branched-chain aliphatic hydrocarbon group, and
hydrogen atoms in the bivalent organic group of $R^5$ may partially be replaced with alkyl group, fluoroalkyl group, carboxyl group, hydroxy group, cyano group or halogen group.

18. A fluorescent material comprising the polymer as claimed in claim 17 and having a light emission quantum yield of 0.1% or greater.

19. A method for producing a polymer represented by the general formula (15),

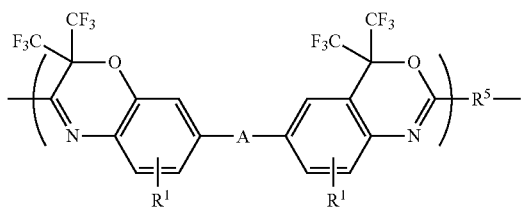

the method comprising conducting a cyclocondensation of a polyamide containing a repeating unit represented by the general formula (12),

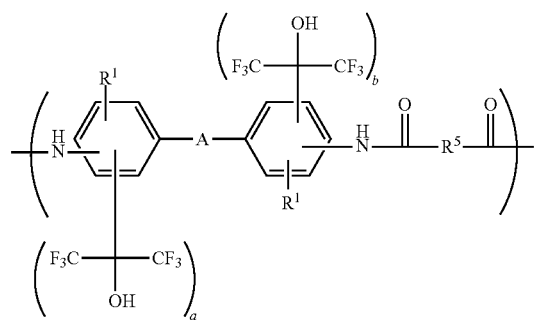

wherein A represents a single bond or $CH_2$, each $R^1$ independently represents a $C_{1-4}$ alkyl group or a halogen group, $R^5$ represents a bivalent organic group containing at least one selected from the group consisting of an aliphatic ring, a heterocyclic ring, an aromatic ring, or a straight-chain or branched-chain aliphatic hydrocarbon group, hydrogen atoms in the bivalent organic group of $R^5$ may partially be replaced with alkyl group, fluoroalkyl group, carboxyl group, hydroxy group, cyano group or halogen group, and each of "a" and "b" independently represents an integer of 0-2, and $1 \leq a+b \leq 4$.

20. The diamine as claimed in claim 3, wherein $R^1$ is a methyl group.

21. A fluorescent material comprising the polyimide as claimed in claim 10 and having a light emission quantum yield of 0.1% or greater.

22. A fluorescent material comprising the polyimide as claimed in claim 11 and having a light emission quantum yield of 0.1% or greater.

* * * * *